US009104589B1

United States Patent
Landon et al.

(10) Patent No.: US 9,104,589 B1
(45) Date of Patent: Aug. 11, 2015

(54) DECODING VECTORS ENCODED WITH A LINEAR BLOCK FORWARD ERROR CORRECTION CODE HAVING A PARITY CHECK MATRIX WITH MULTIPLE DISTINCT PATTERN REGIONS

(71) Applicant: L-3 Communications Corp., New York, NY (US)

(72) Inventors: David G. Landon, Bountiful, UT (US); Ryan W. Hinton, Erda, UT (US); Ayyoob D. Abbaszadeh, Salt Lake City, UT (US)

(73) Assignee: L-3 Communications Corp., New York, NY (US)

( * ) Notice: Subject to any disclaimer, the term of this patent is extended or adjusted under 35 U.S.C. 154(b) by 114 days.

(21) Appl. No.: 14/055,734

(22) Filed: Oct. 16, 2013

(51) Int. Cl.
*H03M 13/00* (2006.01)
*H03M 13/05* (2006.01)
*G06F 11/10* (2006.01)

(52) U.S. Cl.
CPC ..................................... *G06F 11/10* (2013.01)

(58) Field of Classification Search
CPC ..... H04L 1/0057; H04L 1/0071; H04L 1/005; H04L 1/0009; H04L 1/0061; H03M 13/116; H03M 13/2906; H03M 13/2927; H03M 13/13; H03M 13/1102; H03M 13/118; H03M 13/25; H03M 13/1105; H03M 13/27; H03M 13/2707; H03M 13/2721; H03M 13/05; H03M 13/3707; H03M 13/3723; H03M 13/3944
See application file for complete search history.

(56) References Cited

U.S. PATENT DOCUMENTS

| 5,809,043 | A  | * | 9/1998  | Hassan et al. ................. 714/780 |
| 6,539,367 | B1 | * | 3/2003  | Blanksby et al. ............... 706/14 |
| 7,313,752 | B2 | * | 12/2007 | Kyung et al. ................. 714/801 |
| 8,266,493 | B1 |   | 9/2012  | Abbaszadeh et al. |
| 8,719,683 | B2 | * | 5/2014  | Kyung et al. ................. 714/801 |
| 2002/0188906 | A1 | * | 12/2002 | Kurtas et al. ................. 714/755 |
| 2011/0167315 | A1 | * | 7/2011  | Kyung et al. ................. 714/752 |
| 2014/0344639 | A1 | * | 11/2014 | Kyung et al. ................. 714/752 |

OTHER PUBLICATIONS

"Digital Video Broadcasting (DVD); Second generation framing structure, channel coding and modulation systems for Broadcasting, Interactive Services, News Gathering and other broadband satellite applications (DVD-S2)," ETSI EN 302 307 V1.2.1 (Aug. 2009), 78 pages (2009).
Falcao et al., "HDL Library of Processing Units for an Automatic LDPC Decoder Design," IEEE (2006), pp. 349-352.
Rovini et al., "On the Addition of an Input Buffer to an Interactive Decoder for LDPC Codes," IEEE (2007), pp. 1995-1999.
(Continued)

*Primary Examiner* — Phung M Chung
(74) *Attorney, Agent, or Firm* — Kirton | McConkie

(57) ABSTRACT

A decoder for decoding received vectors r encoded in accordance with a forward error correction code having a parity check matrix H with multiple regions at least two of which have patterns of ones with different pattern characteristics. The decoder can include a permuted decode module configured to decode in accordance with a permuted version of the parity check matrix H in which the ones in one of the regions are permuted into a permuted pattern that has a pattern characteristic of the other region. The decoder can also include a reorder module that permutes probabilities of a received vector r to be decoded to correspond with the permuted parity check matrix H.

22 Claims, 14 Drawing Sheets

(56) References Cited

OTHER PUBLICATIONS

Gomes et al., "HDL Library of Processing Units for Generic and DVD-S2 LDPC Decoding," International Conference on Signal Processing and Multimedia Applications (SIGMAP2006), 2006 (8 pages).

Timmerman et al., "Ground Based High Data Rate DVB-S2 Demodulator for High Data Rate AISR Transport," IEEE (2010), pp. 1558-1563.

Gomes et al., "Flexible Parallel Architecture for DVB-S2 LDPC Decoders," IEEE (2007), pp. 3265-3269.

* cited by examiner

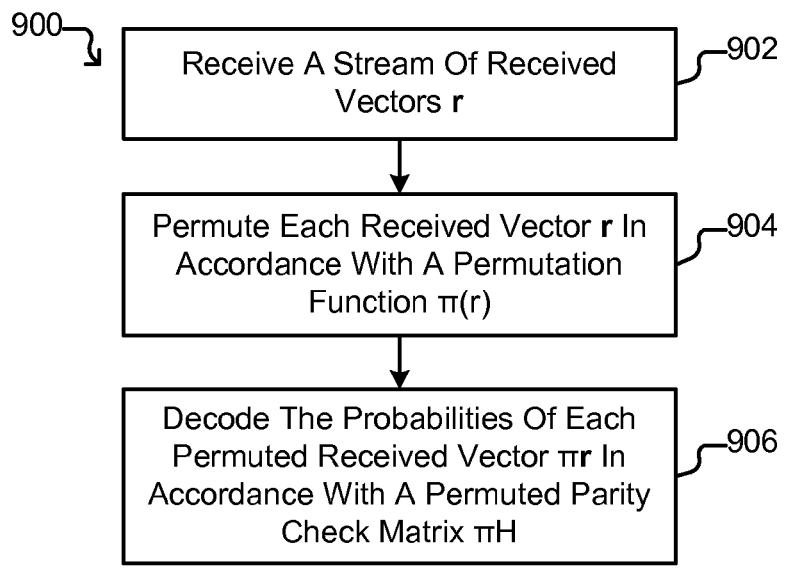
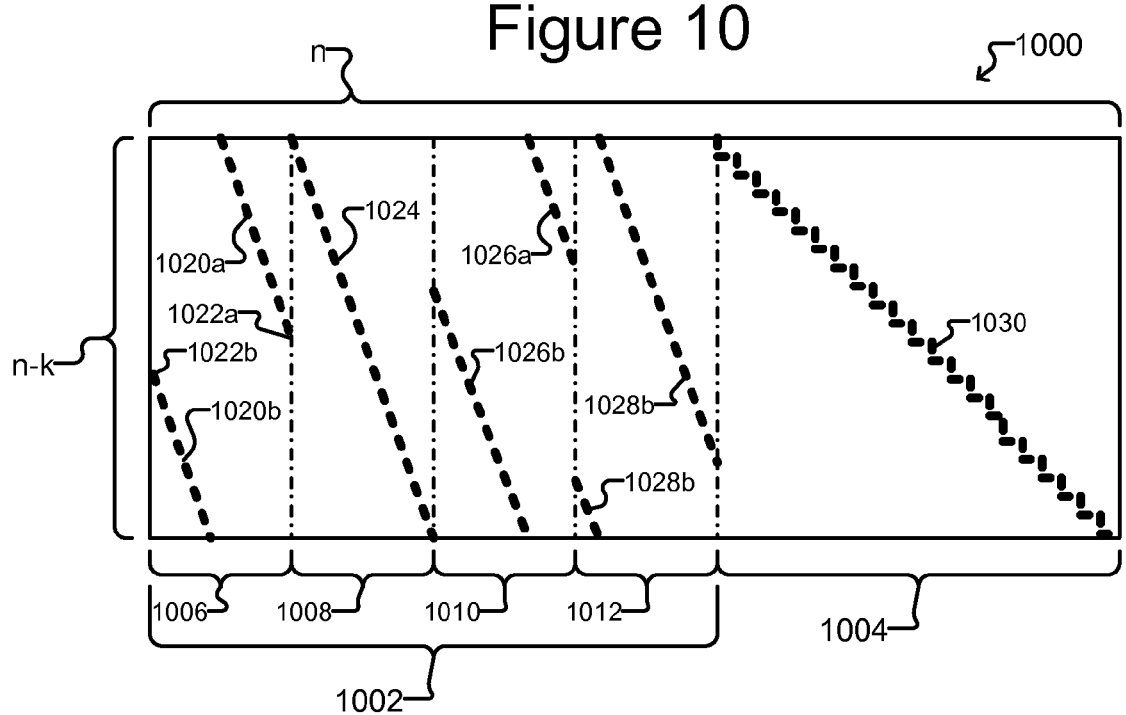

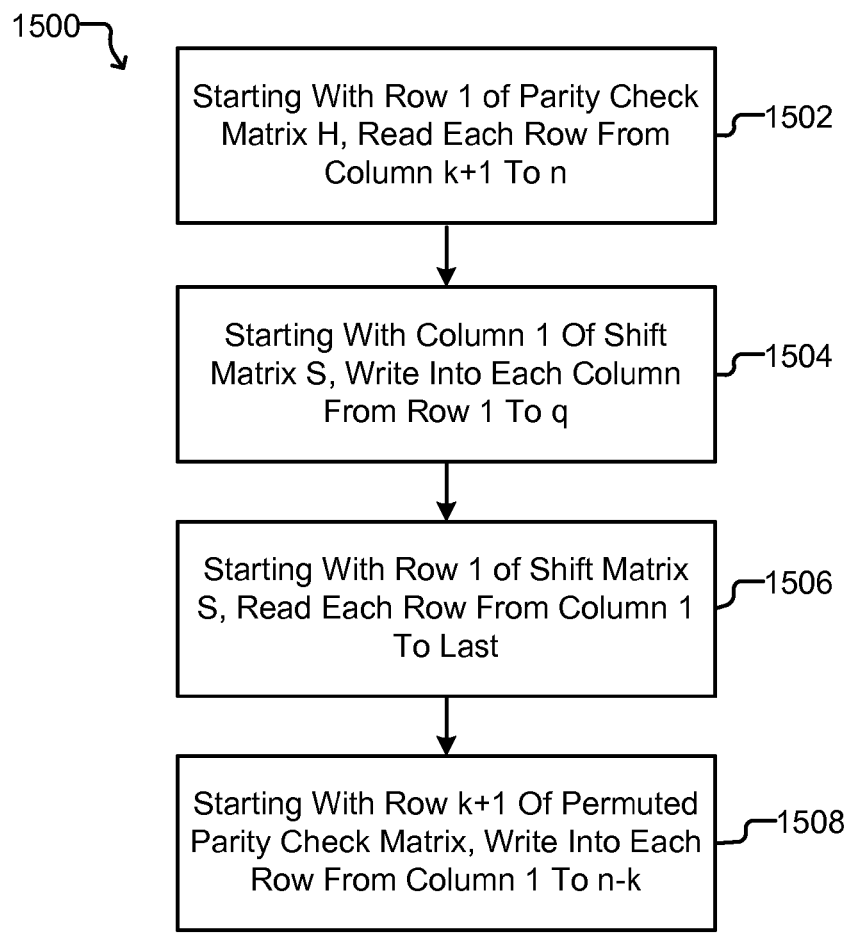
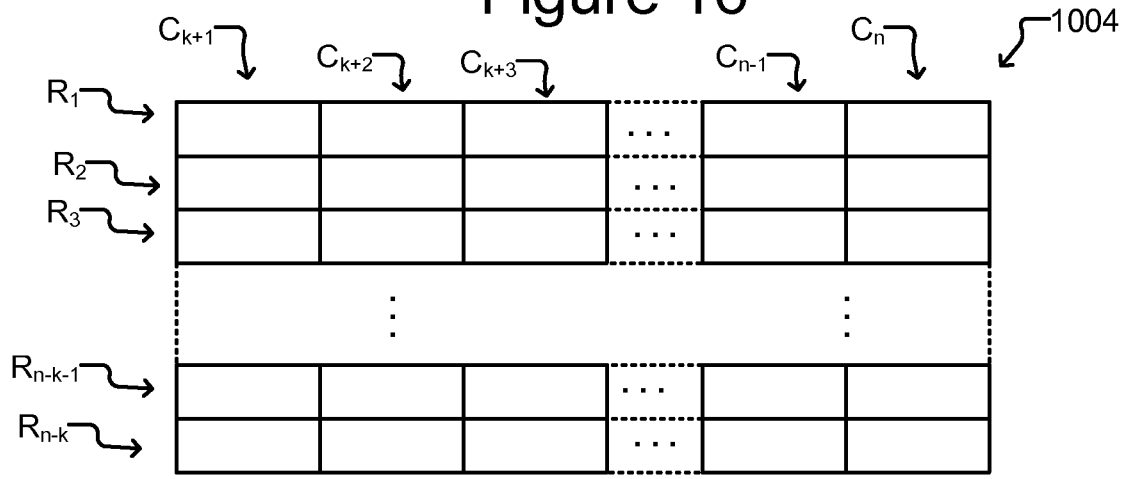

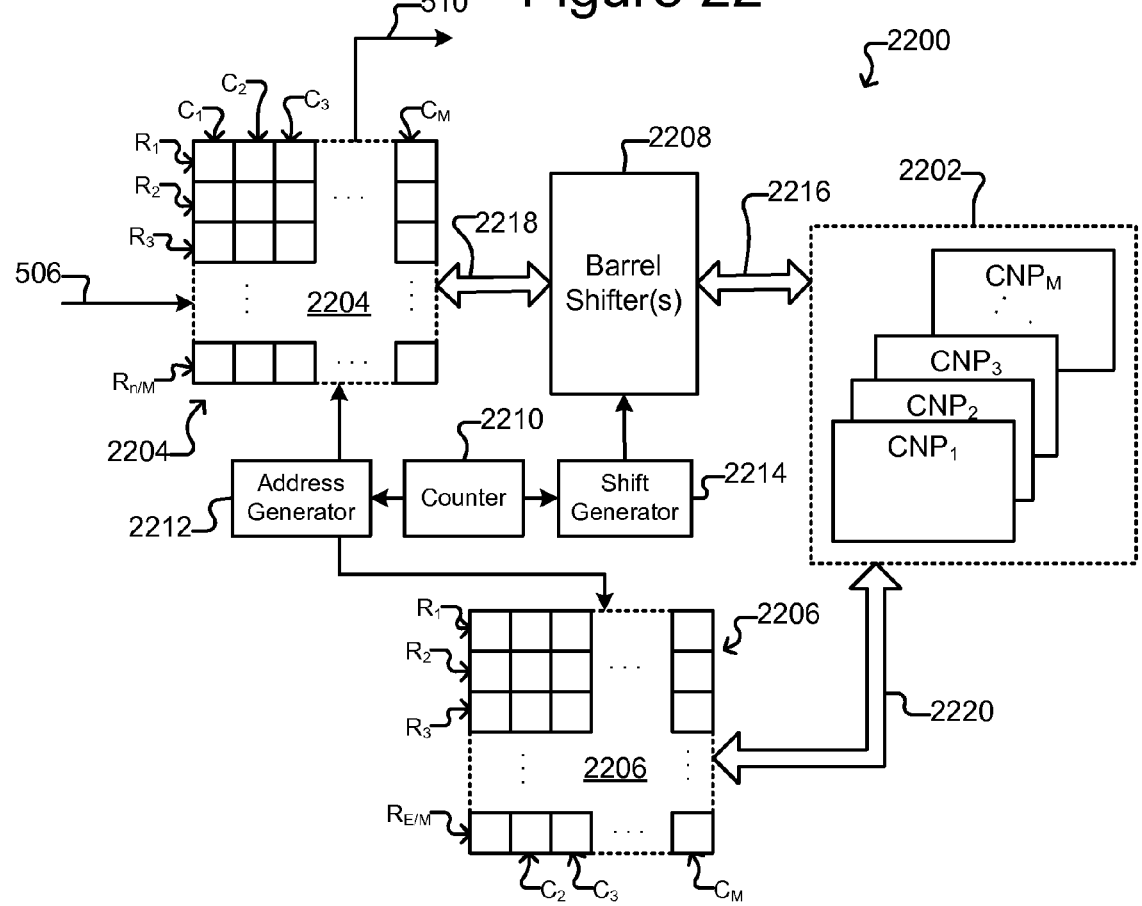

DECODING VECTORS ENCODED WITH A LINEAR BLOCK FORWARD ERROR CORRECTION CODE HAVING A PARITY CHECK MATRIX WITH MULTIPLE DISTINCT PATTERN REGIONS

BACKGROUND

The present invention relates generally to decoding received vectors encoded with a linear block forward error correction (FEC) code having a parity check matrix comprising multiple distinct pattern regions.

It is known to encode message words of a digital message with an FEC code prior to sending the message through a transmission medium. Among other benefits, the FEC encoding allows a decoder at a receiver to detect and correct errors in the received vectors of the transmitted message.

FIG. 1 illustrates an example of a prior art system 100 comprising an encoder 104, a source 108, a receiver 112, and a decoder 116. As shown, the encoder 104 can receive a message stream 102 comprising a plurality of digital message words m each of which comprises k bits $m_1, m_2, \ldots, m_k$. The encoder 104 can encode each message word m into a codeword c, producing a codeword stream 106. Each of the codewords c in the codeword stream 106 can comprise n bits $c_1, c_2, \ldots, c_n$, where n is greater than k. The source 108 can send the codeword stream 106 through a transmission medium 110 to a receiver 112, which receives the transmitted codeword stream 106 as a received vector stream 114.

Distortions and other errors can be introduced into the codewords c by the circuitry of the source 108, the transmission medium 110, and/or the circuitry of the receiver 112, which can render uncertain the values of the bits $c_1, c_2, \ldots, c_n$ at the receiver 112. The codewords c are thus identified at the output of the receiver 112 as received vectors r, and the bits are referred to as probabilities $r_1, r_2, \ldots, r_n$. The receiver 112 is thus shown in FIG. 1 as providing a stream of received vectors r to a decoder 116. The decoder 116 decodes the probabilities $r_1, r_2, \ldots, r_n$ of each received vector r into the bits $c_1, c_2, \ldots, c_n$ of the codewords c from which the decoder 116 can output 118 as a stream 102' of decoded message words m, which should be the same as the original message words m in the stream 102.

The source 108 can be any device that sends digital data to a receiver. For example, the source 108 can be a radio frequency (RF) wireless transmitter, a node in a computer or communications network, a data source such as a data memory (e.g., a digital storage disk), or the like. The receiver 112 can be any type of receiver for receiving data from such a source 108.

Linear block codes are a class of FEC codes. A particular linear block FEC code can be defined by a generator matrix G and/or a corresponding parity check matrix H. The generator matrix G is an n row by k column matrix, which encodes each k-bit message word m in a set of possible message words into a unique n-bit codeword c. For example, for each possible k-bit message word m, multiplication of the message word m by the generator matrix G yields a unique n-bit codeword c. The parity check matrix H is an n–k row by n column matrix. Multiplication of a valid codeword c by the parity check matrix H is zero. The parity check matrix H can thus be used to decode probabilities $r_1, r_2, \ldots, r_n$ of the received vectors r that correspond to codewords c encoded with a linear block FEC code.

FIG. 2 illustrates a simplified example of a parity check matrix H 200 in which the parity check matrix H 200 is a two row by four column matrix. There is a column $C_1, C_2, C_3, C_4$ for each bit c in a codeword c, and the matrix H 200 thus corresponds to four bit codewords c. Each row $R_1, R_2$ of the matrix H 200 defines a parity check calculation for determining whether current estimated values of the probabilities $r_1, r_2, r_3, r_4$ of a received vector r that corresponds to a codeword c being decoded are likely correct.

FIG. 3 illustrates a Tanner-Graph based decode module 300 that corresponds to the parity check matrix H 200. As is known, a Tanner-Graph based decode module of a parity check matrix H has the following characteristics: there is a variable node (VN) for each column of the matrix H and thus each probability $r_1, r_2, r_3, \ldots, r_n$ of a received vector r being decoded; there is a check node (CN) for each row of the matrix H; each VN calculates a new estimated value (EV) of one of the probabilities $r_1, r_2, r_3, \ldots, r_n$ of the received vector r using the current EV and one or more parity check results from check-node-to-variable-node messages (C-VMs) from one or more check nodes (CN); each VN sends its new EV to one or more CNs via a variable-node-to-check-node message (V-CM); each CN performs a parity check calculation defined by one of the rows of the matrix H using EVs received from VNs in the V-CMs; each CN sends its parity check result to one or more VNs via a C-VM; and there is a connection for the V-CMs and C-VMs between each VN and CN that correspond to a "one" in the parity check matrix H.

Accordingly, in FIG. 3, the Tanner-Graph decode module 300 comprises $VN_1$ 302, $VN_2$ 304, $VN_3$ 306, $VN_4$ 308, which correspond respectively to columns $C_1, C_2, C_3, C_4$ of the matrix H 200 of FIG. 2 and thus to the probabilities $r_1, r_2, r_3, \ldots, r_n$ of a received vector r. The module 300 likewise comprises $CN_1$ 312, $CN_2$ 314, which correspond respectively to rows $R_1, R_2$. As also shown in FIG. 3, there is a connection (also known as an "edge") 322, 324, 326, 328, 330 between the VNs 302, 304, 306, 308 and the CNs 312, 314 for each "one" in the parity check matrix H 200. That is, due to the "one" at $R_1, C_1$ of the matrix H 200 in FIG. 2, there is a connection 322 between $VN_1$ 302 and $CN_1$ 312 in FIG. 3. There is also a connection 324 between $VN_2$ 304 and $CN_1$ 312 and a connection 326 between $VN_4$ 308 and $CN_1$ 312 due to the "ones" in the matrix H 200 at $R_1, C_2$ and $R_1, C_4$. There are likewise connections 328 and 330 between $VN_2$ 304 and $CN_2$ 314 and $VN_3$ 306 and $CN_2$ 314 due to the "ones" in the matrix H 200 at $R_2, C_2$ and $R_2, C_3$.

The decoder 116 of FIG. 1 can be configured in accordance with the Tanner-Graph decode module 300 of FIG. 3. In operation, for each received vector r in a received vector stream 114 of FIG. 1, the VNs 302, 304, 306, 308 provide initial estimated values EVs of the probabilities $r_1, r_2, r_3,$ and $r_4$ of the received vector r (in the simplified example illustrated in FIGS. 2 and 3 the number of bits c in a codeword c and thus the number of probabilities r in a received vector r is four) in V-CMs to the CNs 312, 314 through connections 322, 324, 326, 328, 330. Each CN 312, 314 then performs a parity check calculation using the EVs and provides the results in C-VMs to the VNs 302, 304, 306, 308. The VNs 302, 304, 306, 308 then use the parity check calculations in the C-VMs to calculate new EVs for the probabilities $r_1, r_2, r_3,$ and $r_4$ of the received vector r and provide the new EVs in new V-CMs to the CNs 312, 314 after which each CN 312, 314 again performs a parity check calculation using the new EVs and provides the results of the parity check calculations in new C-VMs to the VNs 302, 304, 306, 308. The foregoing iteration of calculations of new EVs by the VNs 302, 304, 306 308 followed by the calculation of new parity checks by the CNs 312, 314 can be repeated until the new EVs for the probabilities $r_1, r_2, r_3,$ and $r_4$ of the received vector r are believed to be the correct values of the bits $c_1$, $c_2$, $c_3$, and $c_4$ of the corresponding codeword c or until the iterations are stopped for other reasons.

In the example illustrated in FIG. 3, each V-CM and C-VM is identified by a subscript indicating the sending and receiving nodes. Thus, V-CM$_{11}$ is a message sent from VN$_1$ 302 to CN$_1$ 312 that contains a new EV for the first probability $r_1$ of the received vector r calculated by VN$_1$ 302, and C-VM$_{11}$ is a message sent from CN$_1$ 312 to VN$_1$ 302 that contains the results of a parity check calculation by CN$_1$. Similarly, V-CM$_{21}$ is a message sent from VN$_2$ 304 to CN$_1$ 312 that contains a new EV for the second probability $r_2$ of the received vector r calculated by VN$_2$ 304, and C-VM$_{12}$ is a message sent from CN$_1$ 312 to VN$_2$ 304 that contains the results of the parity check calculation by CN$_1$ 312. Likewise, V-CM$_{22}$ is a message sent from VN$_2$ 304 to CN$_2$ 314 that contains the new EV for the second probability $r_2$ of the received vector r calculated by VN$_2$ 304, and C-VM$_{22}$ is a message sent from CN$_2$ 314 to VN$_2$ 304 that contains the results of a parity check calculation by CN$_2$ 314. The messages V-CM$_{32}$ and C-VM$_{23}$ follow the same pattern: V-CM$_{32}$ is a message sent from VN$_3$ 306 to CN$_2$ 314 that contains a new EV for the third probability $r_3$ of the received vector r calculated by VN$_3$ 306, and C-VM$_{23}$ is a message sent from CN$_2$ 314 to VN$_3$ 306 that contains the results of a parity check calculation by CN$_2$ 314. The messages V-CM$_{41}$ and C-VM$_{14}$ also follow the same pattern: V-CM$_{41}$ is a message sent from VN$_4$ 308 to CN$_1$ 312 that contains a new EV for the fourth probability $r_4$ of the received vector r calculated by VN$_4$ 308, and C-VM$_{14}$ is a message sent from CN$_1$ 312 to VN$_4$ 308 that contains the results of a parity check calculation by CN$_1$ 312.

Traditionally, a Tanner-Graph based configuration of the probability decoder 116 is configured such that, at each iteration, CNs 312, 314 do not perform their parity check calculations until all VNs 302, 304, 306, 308 have sent all of the messages V-CM, and VNs 302, 304, 306, 308 do not thereafter perform their calculations in the next iteration until all CNs 312, 314 have sent all of the messages C-VM. Recently, however, various configurations of digital processing electronics have been developed for improving the efficiency of Tanner-Graph based configurations of a probability decoder 116. For example, each VN and CN can be implemented in one or more processors that are connected serially and/or in parallel to perform efficiently the calculations of the VNs and CNs. Processing efficiency has been achieved in some cases by tailoring the interconnections of such processors to particular patterns of the "ones" in the parity check matrix H. This has allowed, for example, the Tanner-Graph implementation to be based on a sub-set of the columns and/or rows of the parity check matrix H and then repeatedly applied to the parity check matrix H until all of the columns and/or rows have been processed. Some FEC codes, however, have a parity check matrix H comprising multiple regions in which the patterns of "ones" have different pattern characteristics. Prior configurations of Tanner-Graph based probability decoding modules have not efficiently addressed decoding such FEC codes. Embodiments of the present invention provide efficient decoding of FEC codes in which the parity check matrix H comprises multiple regions in which the pattern of "ones" in at least two of those regions have different pattern characteristics.

SUMMARY

Some embodiments of the invention can comprise a device or process for decoding a received vector r encoded in accordance with a forward error correction code. The received vector r can be permuted in accordance with a permutation function, and the resulting permuted received vector πr can be decoded using a permuted version of the parity check matrix H to which the forward error correction code corresponds.

BRIEF DESCRIPTION OF THE DRAWINGS

FIG. 9 shows an example of a process for decoding received vectors r with the decoder of FIG. 5 according to some embodiments of the invention.

FIG. 10 illustrates an example of a parity check matrix H.

FIG. 15 shows an example of a process for permuting the second region of the parity check matrix H of FIG. 10 according to some embodiments of the invention.

FIG. 16 shows cells of the second region of the parity check matrix H of FIG. 10.

FIG. 22 shows an example of a configuration that can implement the permuted decode module of FIG. 5 according to some embodiments of the invention.

DETAILED DESCRIPTION OF EXEMPLARY EMBODIMENTS

Figure 1:
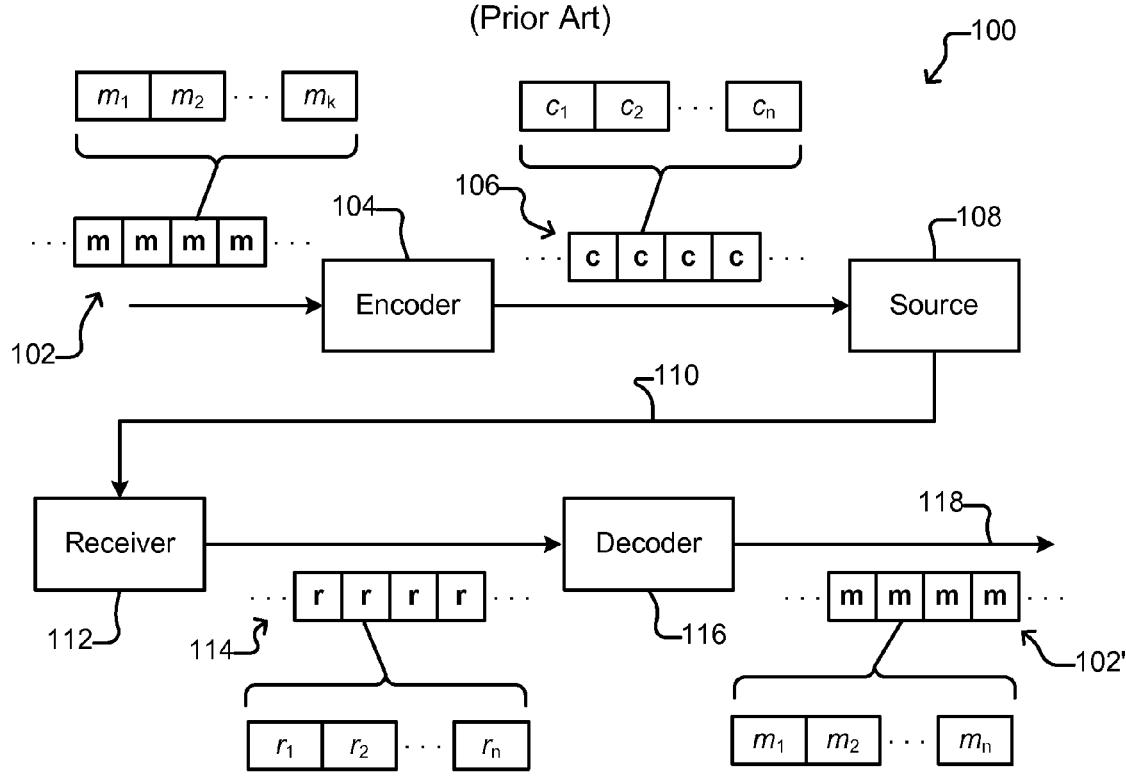
FIG. 1 is a block diagram of a prior art data transmission system illustrating forward error correction coding.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "permute" means "to change the order, sequence, or arrangement of."

The symbol "/" means mathematical division, and the symbol "−" means mathematical subtraction. The symbol "+" means mathematical addition. The symbol "*" means mathematical multiplication. The symbol "=" means mathematical equality. The term "mod" means a mathematical modulo operation.

As used herein, "matrix" means a two-dimensional array of binary cells each of which can be in a "high" state or an opposite "low" state. The term "one" or "ones" when used with reference to a matrix, refers to the cell or cells in the matrix that are in the high state, and the term "zero" or "zeros" refers to the cell or cells in the matrix that are in the low state.

As used herein, a "message word" is sometimes abbreviated m and is a plurality of bits m that represents information content. A "bit" is a binary digit that has two and only two possible states: a "low" state, and a "high" state. The term "one" with reference to a bit means the high state, and the term "zero" with reference to a bit means the low state. As used herein, a "first" state of a bit refers to either the high (one) state or the low (zero) state of the bit, and a "second" state of the bit refers to the opposite state.

A "codeword" is sometimes abbreviated c and is used herein to refer to a plurality of bits c that both encode a message word and provide forward error correction capability to detect and correct transmission errors in the codeword at the receiver after the codeword has been sent (e.g., transmitted) through a transmission medium and received at a receiver.

A "codeword" that has been transmitted through a transmission medium and received at a receiver is referred to herein as a "received vector," which is sometimes abbreviated herein r. The bits of a received vector r are referred to herein as "probabilities" r because the original state of the bit c to which each probability corresponds in the corresponding codeword c may have changed or become unclear due to transmission distortion or other types of transmission errors.

As used herein, "transmission" refers to transmission of codewords c in a signal by an electronic or electromagnetic transmitter through a transmission medium (e.g., free space, ambient air, a transmission line, an electrical cable, an electrical trace, an electrical wire, or the like) to an electronic or electromagnetic receiver.

In some embodiments, the present invention can be directed to or include a decoder for decoding received vectors r encoded with a forward error correction (FEC) code that corresponds to a parity check matrix H that has at least two regions in which the pattern characteristics of "ones" are significantly different, making efficient decoding of the regions difficult. In some embodiments, a decoder corresponding to the present invention can be based on a permuted version of the parity check matrix H in which the pattern of "ones" in one or more of the regions is permuted so that all of the regions of the permuted parity check matrix all have similar or the same pattern characteristics. Among other possible advantages, the decoder can correspond to only a sub-set of the columns of the permuted parity check matrix πH, which can allow the decoder to be significantly smaller and less complex than a decoder that corresponds to all of the columns of the permuted parity check matrix πH. Because the pattern of "ones" in all regions of the permuted parity check matrix πH is similar or the same, the smaller decoder can be applied to all of the columns of the permuted parity check matrix πH by sequentially applying the decoder to a series of the sub-sets of the columns until the smaller decoder has been applied to all of the columns.

Figure 4:
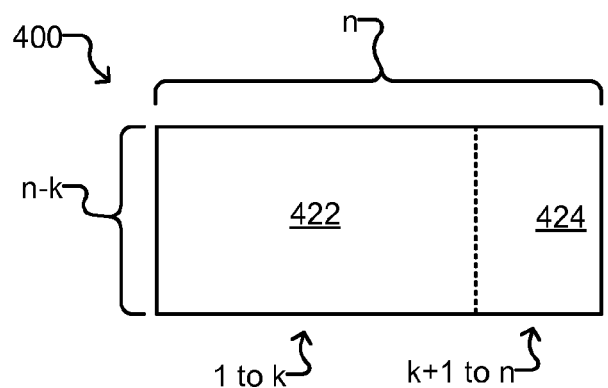
FIG. 4 illustrates a parity check matrix H having a first region in which the "ones" are disposed in a pattern having a first pattern characteristic and a second region in which the "ones" are disposed in a pattern having a second pattern characteristic different than the first pattern characteristic.

FIG. 4 illustrates a parity check matrix H 400 comprising multiple contiguous regions 422, 424 in which the pattern of "ones" in at least two of the regions has a distinct and different characteristic. Although two regions 422, 424 are shown, there can be more. Alternatively, parity check matrix H 400 can consist only of the regions 422, 424. Generally as discussed above, the parity check matrix H 400 and/or a corresponding generator matrix G (not shown) define a linear block FEC code in which: (1) for each unique k-bit message word m (i.e., a message word that is k bits in length) of a message word set, the product of multiplying the message word m by the generator matrix G is a unique codeword c n bits in length ($m_i * G = c_i$, wherein $m_i$ is the ith message word in the set and $c_i$ is a corresponding unique codeword); and (2) for each such valid codeword c, the product of multiplying the valid codeword c by the parity check matrix H 400 is zero ($c_i * H = 0$).

As shown in FIG. 4, the parity check matrix H 400 of FIG. 4 can comprise n−k rows and n columns. The parity check matrix H 400 can correspond to a linear block FEC code, and the first region 422 can accordingly correspond to the k bits of the encoded message word m, and the second region 424 can correspond to n−k parity bits added to the message word m to form the codeword c. Although the "zeros" and "ones" in each cell defined by a row and column of the matrix H 400 are not illustrated in FIG. 4, the pattern of "ones" in the first region 422 comprising all of the rows n−k and columns 1 to k can have a first pattern characteristic, and the pattern of "ones" in the second region 424 comprising all of the rows n−k and columns k+1 to n can have a second pattern characteristic, which can be significantly different than the first pattern characteristic. Moreover, in some embodiments, the first pattern characteristic is not a characteristic of the pattern of "ones" of the second region 424, and the second pattern characteristic is not a characteristic of the pattern of "ones" of the first region 422.

Figure 5:
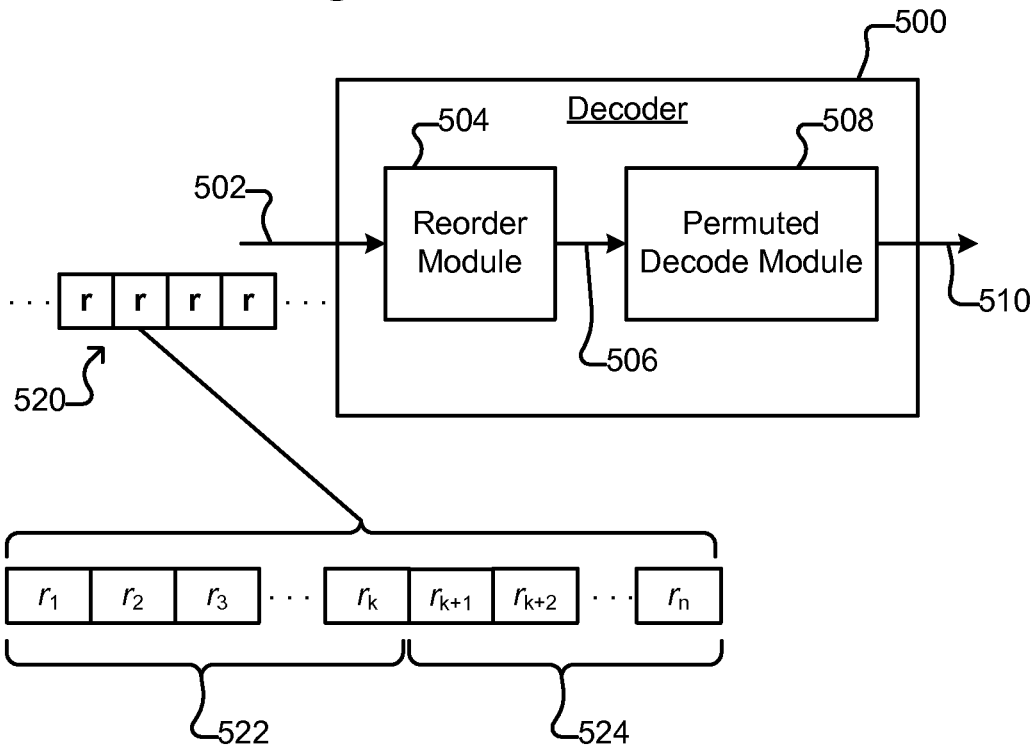
FIG. 5 illustrates a decoder for receiving and decoding a stream of received vectors encoded in accordance with an FEC code that corresponds to the parity check matrix H of FIG. 4 according to some embodiments of the invention.

The difference between the first pattern characteristic of the "ones" in the first region 422 and the second pattern characteristic of "ones" in the second region 424 can make it difficult to decode efficiently the received vectors r. For example, the configuration of a decoder based on a Tanner-Graph implementation of the first region 422 is necessarily different than the configuration with respect to the second region 424 because the pattern of "ones" are different in the regions 422, and 424. Hardware and/or software implementing a Tanner-Graph configuration corresponding to the first region 422 thus cannot also be used with respect to the second region 424. FIG. 5 illustrates a decoder 500 configured for efficiently decoding received vectors r coded in accordance with the parity check matrix H 400 according to some embodiments of the invention.

Figure 6:
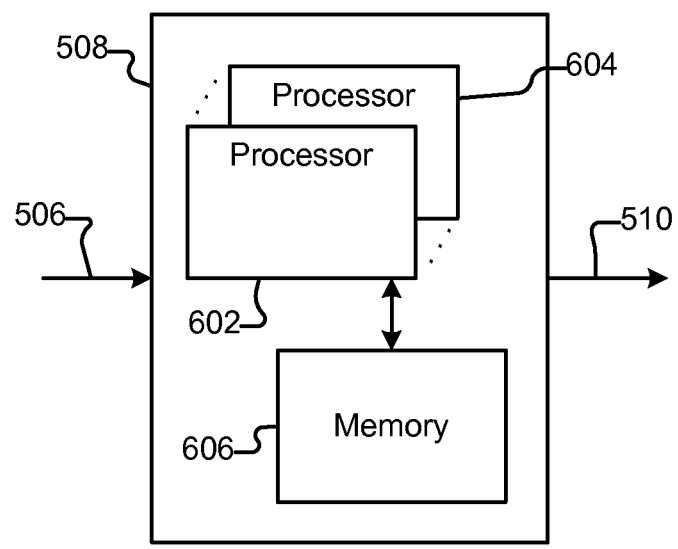
FIG. 6 shows an example of a configuration of the permuted decode module of FIG. 5 comprising one or more processors and a memory according to some embodiments of the invention.

As shown in FIG. 5, the decoder 500 can comprise an input 502, a reorder module 504, a permuted decode module 508, and an output 510. As shown in FIG. 6, the permuted decode module 508 can comprise one or more processors 602, 604 (two are shown but there can be more or fewer) and at least one memory 606. Each processor 602, 604 can comprise hardwired logic circuits and/or a microprocessor configured to operate in accordance with software, firmware, microcode, or other forms of machine executable instructions stored in the memory 606 in the form of non-transitory signals. If there is more than one processor 602, 604, those processors can be interconnected in serial, parallel, and/or other interconnection configurations. Each processor 602, 604 can be, for example, a digital microprocessor, digital microcontroller, computer, or the like. The memory 606 can comprise one or more digital storage devices such as semiconductor, magnetic, optical, or other such digital storage devices.

Figure 3:
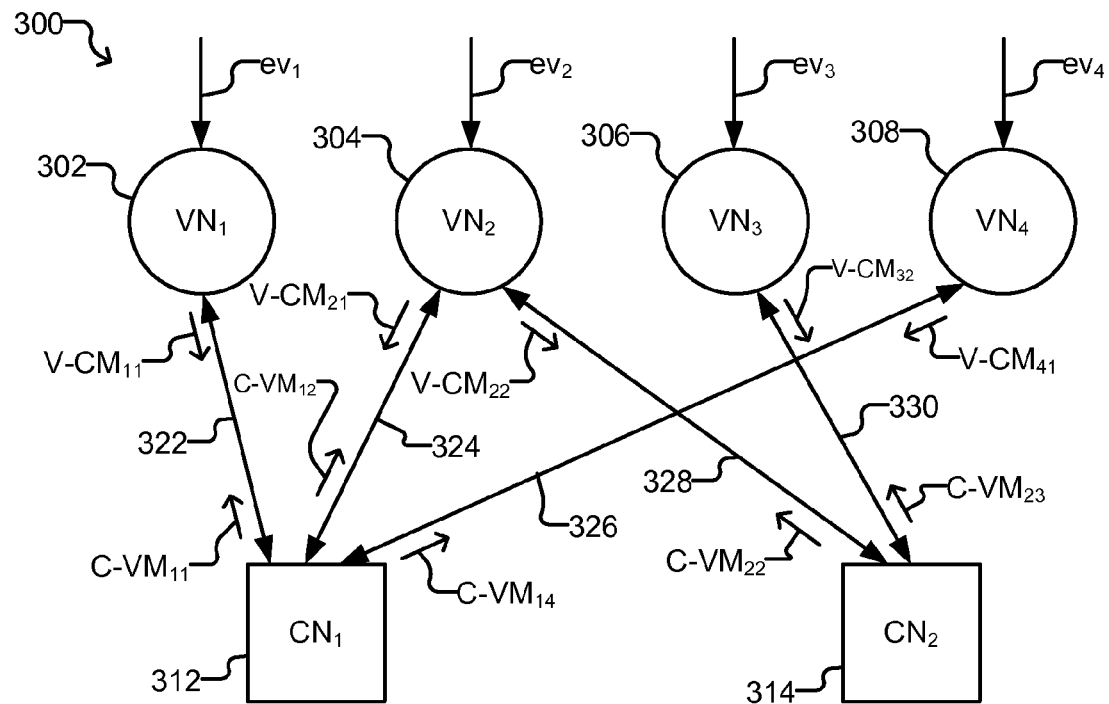
FIG. 3 illustrates a prior art Tanner-Graph decode module for decoding received vectors in accordance with the parity check matrix H of FIG. 2.
Figure 7:
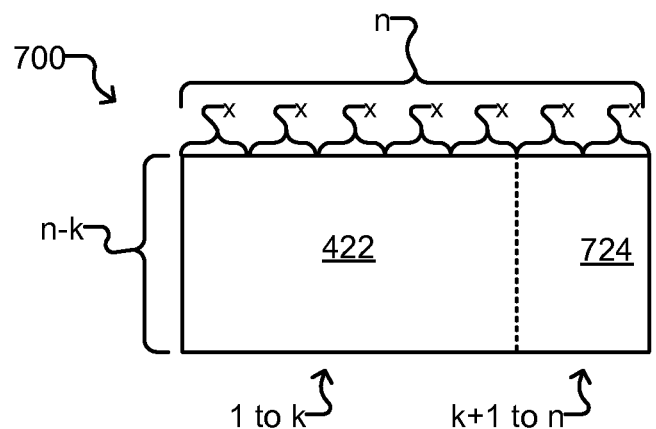
FIG. 7 shows a permuted parity check matrix πH in which the second region of the parity check matrix H of FIG. 4 is permuted to have the first pattern characteristic according to some embodiments of the invention.

Regardless of the number of processors 602, 604 and how those processors are interconnected, the permuted decode module 508 can be configured to implement the Tanner-Graph module (e.g., like the module 300 of FIG. 3) not of the parity check matrix H 400 but a permuted version of the parity check matrix H 400 in which the pattern of "ones" in one of the regions 422 or 424 is permuted to have the pattern characteristic(s) of the other region 424 or 422. For example, the parity check matrix H 400 can be subjected to a permutation function π(H) that reorders the "ones" in the second region 424 into a permuted pattern that has the first pattern characteristic of the first region 422. This can produce a permuted parity check matrix πH 700, as shown in FIG. 7, comprising the first region 422 unchanged and a permuted second region 724, which is a permuted version of the second region 424. The "ones" in both regions 422 and 724 of the permuted matrix πH 700 can thus be made to have the same pattern characteristic or characteristics, which in this example is the first pattern characteristic of the first region 422. Of course, the first region 422 rather than the second region 424 can be permuted, or both regions 422, 424 can be permuted. The permuted decode module 508 can be configured to decode in accordance with the permuted matrix all 700 rather than the matrix H 400.

For example, the permuted decode module 508 can be configured in accordance with a Tanner-Graph decoding implementation of the permuted party check matrix πH 700 rather than the parity check matrix H 400. Moreover, because the pattern of "ones" is uniform over the entire permuted parity check matrix πH 700, the permuted decode module 508 can be configured in accordance with only a sub-set of the columns of the permuted parity check matrix πH 700, and the permuted decode module 508 can be applied to all of the columns of the parity check matrix πH 700 by sequentially applying the permuted decode module 508 to a sequence of different sub-sets of the columns of the parity check matrix πH 700 until all of the columns have been processed. The permuted decode module 508 can thus be smaller and less complex (e.g., have fewer interconnections) than a decoder based on a Tanner-Graph implementation of the parity check matrix H 400.

Figure 2:
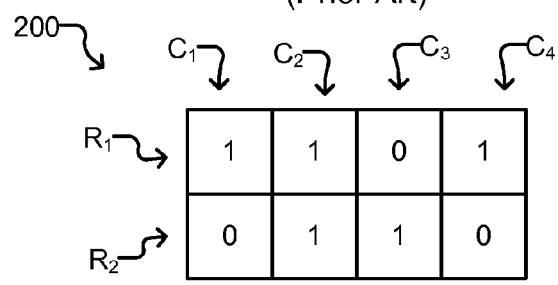
FIG. 2 is illustrates a simplified prior art parity check matrix H.

Thus, for example, as illustrated in FIG. 7, the n columns of the permuted parity check matrix πH 700 can be divided into sub-sets of x columns (where x is a non-zero integer). There can thus be n/x number of such sub-sets. The permuted decode module 508 can be configured to process x of the columns in parallel. That is, the permuted decode module 508 can have x variable nodes (each like any of $VN_1$ to VN4 of FIG. 3) each corresponding to one of the x columns in one of the sub-sets, and the permuted decode module 508 can also have n−k check nodes (each like any of $CN_1$ or $CN_2$ in FIG. 3) each corresponding to one of the n−k rows of the permuted matrix πH 700. Also generally as discussed above with respect to FIGS. 2 and 3, there can be a connection (also known as an "edge") between one of the x variable nodes and one of the n−k check nodes for each "one" in any of the sub-sets of x columns of the permuted matrix πH 700. The variable nodes and check nodes can send each other V-CMs and C-VMs through such connections as discussed above with regard to FIGS. 2 and 3. As noted above with respect to FIG. 6, the calculations performed by the variable nodes and check nodes can be performed by one or more processors 602, 604 generally as discussed above with respect to FIG. 6.

Generally as discussed above, the permuted decode module 508 can thus be configured to implement a Tanner-Graph associated with the permuted parity check matrix πH 700. For the permuted decode module 508 to properly decode a received vector r, however, the probabilities r of the received vector r must similarly be permuted. The foregoing can be performed by the reorder module 504 of FIG. 5.

As shown in FIG. 5, a stream 520 of received vectors r can be received at the input 502 of the decoder 500. As noted above with regard to FIG. 1 and illustrated again in FIG. 5, each received vector r can comprise probabilities $r_1, r_2, \ldots r_n$. As also illustrated in FIG. 5, each received vector r can comprise a first section 522 comprising probabilities $r_1, r_2, \ldots, r_k$ and a second section 524 comprising probabilities $r_{k+1}, r_{k+2}, \ldots r_n$. The probabilities $r_1, r_2, \ldots, r_k$ of the first section 522 can correspond to the information bits $m_1, m_2, \ldots, m_k$ of the encoded message word m (see FIG. 1) and thus the first region 422 of the parity check matrix H 400, and the probabilities $r_{k+1}, r_{k+2}, \ldots r_n$ of the second section 524 can correspond to the parity bits added by the encoding of message word m into the codeword c (see FIG. 1) and thus the second region 424 of the parity check matrix H 400.

The reorder module 504 can permute the probabilities r in the first section 522 or the second section 524 in accordance with the permutation of the permuted parity check matrix $\pi$H 700. For example, if the permutation function $\pi$(H) was applied to the parity check matrix H 400 to produce the permuted parity check matrix $\pi$H 700 as discussed above, then the same permutation or a corresponding permutation function $\pi$(r) can be applied to each received vector r to produce a permuted version of the received vector $\pi$r.

Figure 8A:
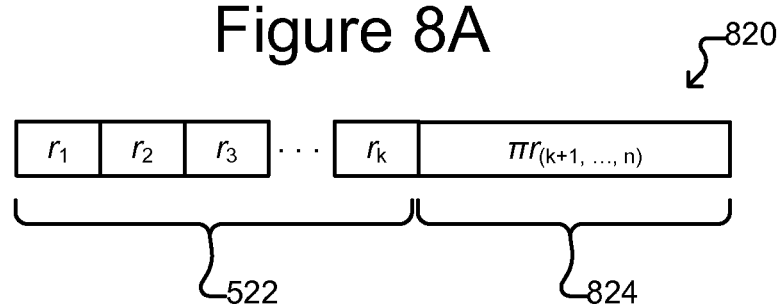
FIG. 8A illustrates a permuted received vector πr in which a second section is permuted in accordance with the permutation function by which the second region of the permuted parity check matrix πH of FIG. 7 was permuted according to some embodiments of the invention.

As discussed above, in the example illustrated in FIG. 7, the second region 424 of the parity check matrix H 400 was permuted in accordance with the permutation function $\pi$(H) to produce the permuted parity check matrix $\pi$H 700 comprising the first region 424 and a permuted second region 724. In accordance with that example, the same or a corresponding permutation function $\pi$(r) can be applied to each received vector r to produce a permuted received vector $\pi$r 820 in which the first section 522 is unchanged but the second section 524 (see FIG. 5) is changed to the permuted second section 824 as shown in FIG. 8A. In the permuted second section 824, the order of the probabilities $r_{k+1}, r_{k+2}, \ldots r_n$ can be changed to correspond to the permuted second region 724 of the permuted parity check matrix $\pi$H 700.

Figure 8B:
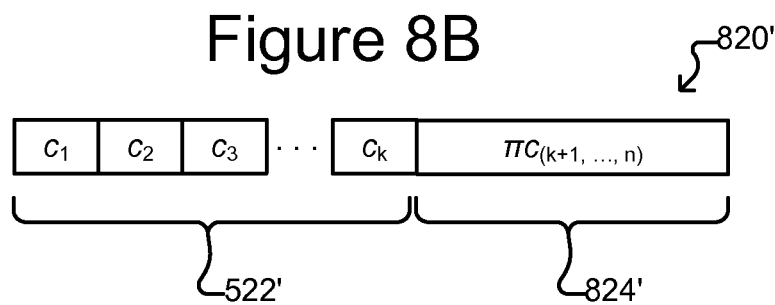
FIG. 8B illustrate the permuted received vector πr of FIG. 8A in which the information probabilities $r_1, r_2, r_3, \ldots, r_k$ are decoded into bits $c_1, c_2, c_3, \ldots, c_k$.

The reorder module 504 can thus change the order of the probabilities r in each received vector r in the stream 520 to correspond to the permuted parity check matrix $\pi$H 700 and output 506 the resulting permuted received vectors $\pi$r 820 (see FIG. 8A) to the permuted decode module 508. With reference to FIGS. 5, 8A, and 8B, the permuted decode module 508 can decode each permuted received vector $\pi$r 820 into bits c of a corresponding permuted codeword $\pi$c 820'. As shown in FIG. 8B, a permuted codeword $\pi$r 820' can comprise a first region 522' of bits $c_1, c_2, c_3 \ldots c_k$ and the permuted second region 824' of bits $\pi c_{(k+1)}, \ldots, {}_n)$. The bits $c_1, c_2, c_3 \ldots c_k$ of the first region 522' can be the decoded probabilities $r_1, r_2, r_2, \ldots r_k$ of the first region 522' of the permuted received vector $\pi$r 820, and the bits $\pi c_{(k+1)}, \ldots, {}_n)$ of the permuted second region 824' can be the decoded permuted probabilities $\pi r_{(k+1)}, \ldots, {}_n)$ of the permuted second region 824 of the permuted received vector $\pi$r 820.

As noted, the decoded probabilities $c_1, c_2, c_3, \ldots c_k$ of the first region 522' of the permuted codeword $\pi$c 820' can be the information bits $m_1, m_2, \ldots m_k$ of the original message word m (see FIG. 1). In such case, the decoded permuted bits $\pi c_{(k+1)}, \ldots, {}_n)$ of the permuted second region 824' (see FIG. 8B) can be discarded. In other embodiments, additional processing modules (not shown) can be provided to further process the output 510 in FIG. 5 to obtain the original message word m. For example, the original codeword c can be obtained from the permuted codeword $\pi$c of FIG. 8B output at 510 of FIG. 5 be applying a reverse of the permutation function $\pi$(H) to the permuted second region 824' of the permuted codeword $\pi$c of FIG. 8B. The resulting codeword c can then be decoded into the original message word m.

Referring again to FIGS. 5 and 6, the reorder module 504 can comprise hardwired logic, one or more microprocessors, microcontrollers, computers, and/or the like (e.g., like processors 602, 604 of FIG. 6) configured to operate in accordance with software, firmware, microcode, or similar machine executable instructions stored as non-transitory signals in a memory (e.g., like memory 606).

The process 900 of FIG. 9 illustrates the above-described operation of the decoder 500. That is, at step 902, the process 900 can receive the stream 520 of received vectors r as illustrated in FIG. 5 and discussed above. At step 904, the process 900 can permute each received vector r received at step 902 in accordance with a permutation function $\pi$(r) that corresponds to the permutation function $\pi$(H) applied to the parity check matrix H 400 to obtain the permuted parity check matrix $\pi$H 700 as discussed above. At step 906, the process 900 can decode the probabilities r of each permuted received vector $\pi$r 820 as discussed above.

FIG. 10 illustrates an example of a parity check matrix H 1000 that corresponds to a quasi-cyclic (QC), irregular repeat accumulate (IRA) low density parity check (LDPC) code, which is a type of systematic linear block FEC code. The twenty-one DVB-S2 codes (hereinafter the "DVB-S2 Codes") defined in the paper entitled "Second Generation Framing Structure, Channel Coding and Modulation Systems for Broadcasting, Interactive Services, News Gathering and Other Broadband Satellite Applications," ETSI EN 302 307 V1.2.1 (2009-08), 650 Route des Lucioles F-06921 Sophia Antipolis Cedex, FRANCE can be characterized generally as examples of QC-IRA LDPC or near QC-IRA LDPC codes. As will be seen, the parity check matrix H 1000 can comprise a first region 1002 comprising contiguous sub-matrices 1006, 1008, 1010, 1012 (four are shown but there can be more or fewer) in which the pattern of "ones" has a first pattern characteristic. The matrix H 1000 can also comprise a second region 1004 in which the pattern of "ones" has a second pattern characteristic that is different than the first pattern characteristic. The matrix H 1000 can thus be a specific example of the more general matrix H 400 of FIG. 4, and the first and second regions 1002, 1004 can be examples, respectively, of the first and second regions 422, 424.

As illustrated in FIG. 10, the parity check matrix H 1000 is an n−k row by n column matrix. The matrix H 1000 thus comprises an array of cells each corresponding to one of the rows and one of the columns. Although not shown, the parity check matrix H 1000 corresponds to an n by k generator matrix G (not shown) that encodes k-bit message words m into n-bit codewords c, and multiplication of any of the valid codewords c by the parity check matrix H 1000 is zero. The first region 1002 can thus correspond to the k information bits of the received vectors r to be decoded. The second region 1004 can comprise all n−k rows and the last n−k columns of the matrix H 1000, and can thus correspond to the parity bits of the received vectors r to be decoded. In some embodiments, the parity check matrix H 1000 can consist only of the regions 1002, 1004, which can be contiguous.

Although not shown, each cell of the matrix H 1000 consists of a binary digit that is in a "zero" or a "one" state as discussed above. Because the matrix H 1000 is the parity check matrix of an LDPC code, however, most of the cells are "zeros." In FIG. 10, the cells that correspond to "ones" are indicated by lines 1020, 1024, 1026, 1028 and pattern 1030. Otherwise, the cells are "zeros."

As shown in FIG. 10, the first region 1002 can comprise a plurality of contiguous n−k row by M column sub-matrices 1006, 1008, 1010, 1012. In some embodiments, the first region 1002 can consist solely of the sub-matrices 1006, 1008, 1010, 1012. Regardless, although four sub-matrices 1006, 1008, 1010, 1012 are shown, there can be more or fewer. In fact, the number of sub-matrices 1006, 1008, 1010, 1012 can be an integer equal to k/M. All of the "ones" in each of the sub-matrices 1006, 1008, 1010, 1012 can be on any one of multiple possible lines that has a slope q, where q is equal to n−k/M. Moreover, no such line crosses from one sub-matrix to another 1006, 1008, 1010, 1012. Rather, if such a line reaches the last column of its sub-matrix 1006, 1008, 1010, 1012, the line wraps with slope q from the last column of the sub-matrix to the first column of the same sub-matrix, where the line continues with the same slope q.

An example is shown in FIG. 10 in which a first segment 1020a of a line 1020 in sub-matrix 1006 wraps at 1022a from the last column of the sub-matrix 1006 to the first column at 1022*b* from which a second segment 1020*b* of the line 1020 continues. Moreover, the first segment 1020*a*, the wrap from 1022*a* to 1022*b*, and the second segment 1020*b* have the slope q. Line 1024 in sub-matrix 1008 is also an example of a line with slope q. The line 1024, however, stops before wrapping. Wrapped line 1026 comprising first and second segments 1026*a*, 1026*b* is an example of a wrapped line with slope q in the sub-matrix 1010, and wrapped line 1028 comprising first and second segments 1028*a*, 1028*b* is an example of such a line with slope q in the sub-matrix 1012.

Although not shown, there can be multiple such lines in one or more of the sub-matrices 1006, 1008, 1010, 1012. Each such line has a slope equal to q and no such line crosses from one sub-matrix 1006, 1008, 1010, 1012 to another sub-matrix. Rather, each such line either terminates at or prior to the last column of its sub-matrix 1006, 1008, 1010, 1012 or wraps from the last column to the first column of its sub-matrix like line 1020 as discussed above. Moreover, as stated above, all "ones" in the first region 1002 of the matrix H 1000 are (or are points) on such lines.

Figure 11:
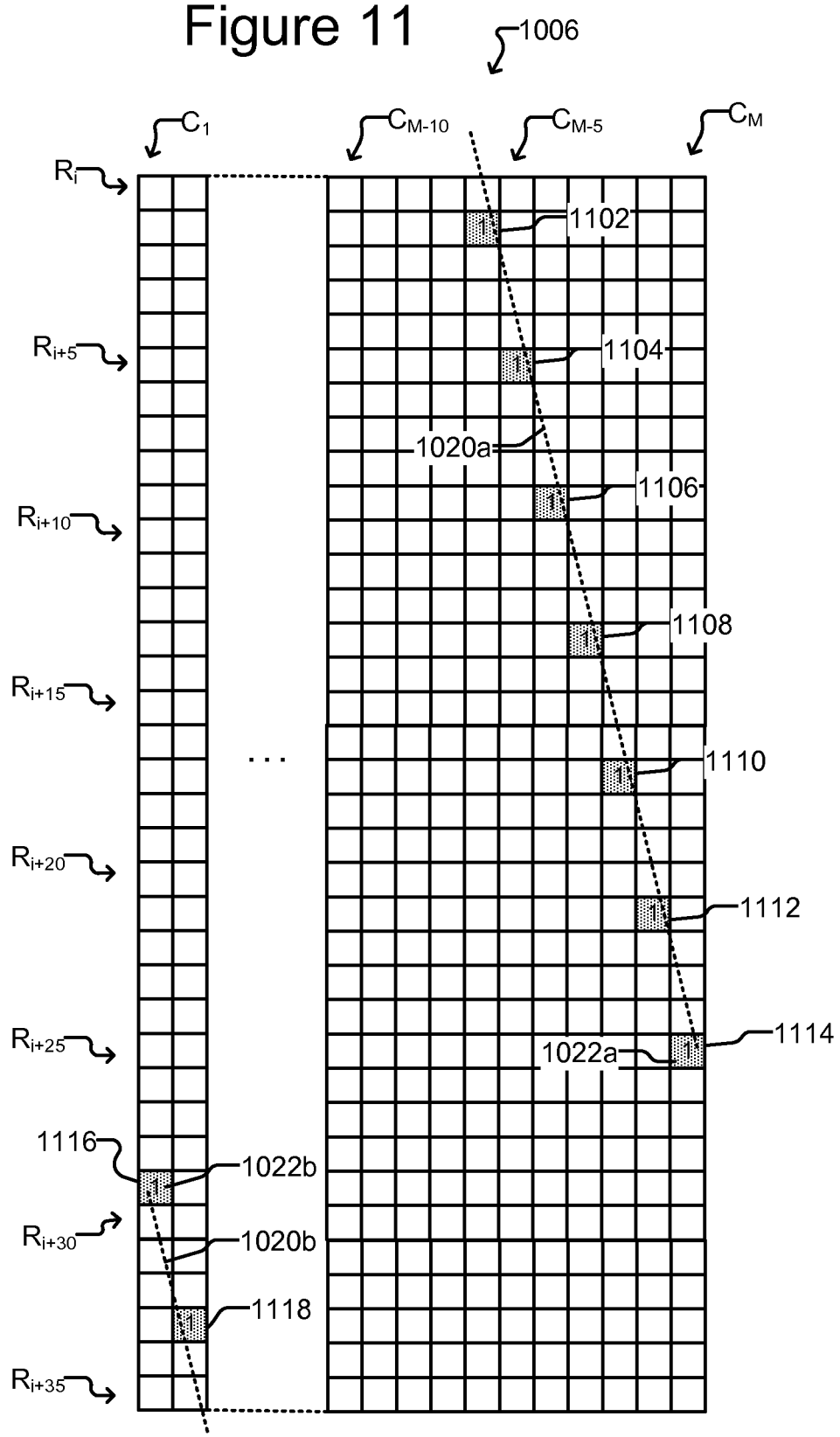
FIG. 11 illustrates cells in a "one" state disposed in a wrapped line having a slope q in a first n–k row, M column sub-matrix of the first region of the parity check matrix H of FIG. 10.

FIG. 11 illustrates part of the sub-matrix 1006, showing rows $R_i$ to $R_{i+35}$ and columns $C_1$ to $C_M$ of the sub-matrix 1006. Cells with "ones" are labeled with the number "1" and highlighted; all other cells have "zeros." Cells 1102, 1104, 1106, 1108, 1110, 1112, and 1114 with "ones" define or form part of (e.g., the "ones" are on or are points on) the first segment 1020*a* of the line 1020 in FIG. 10. As can be seen, the pattern is such that the cells 1102, 1104, 1106, 1108, 1110, 1112, and 1114 with "ones" are spaced four columns and one row from each other. The value of q in the example shown in FIG. 11 is thus negative four. As also shown, at cell 1114, the first segment 1020*a* of the line 1020 wraps from the last column (labeled $C_M$ in FIG. 11) of the sub-matrix 1006 to the first column (labeled $C_1$ in FIG. 11) at cell 1116, where the pattern continues with "ones" at cells 1116 and 1118 defining the second segment 1020*b* of the line 1020 also with q equal to negative four. Note that the wrapping from cell 1114 to cell 1116 also has a q value of negative four. That is, cell 1116 is four rows below cell 1114. A q value of negative four is an example only, and q can have other integer values.

Characteristics of the pattern of "ones" in the first region 1002 of matrix H 1000 thus include that all such "ones" are (or correspond to points) on a line that has one or more of the following characteristics: the line has a slope equal to q (where q=(n−k)/M as discussed above); the line does not cross from one sub-matrix 1006, 1008, 1010, 1012 to another but is confined to a single sub-matrix 1006, 1008, 1010, 1012; and/or the line wraps with the slope equal to q from the last column of its sub-matrix 1006, 1008, 1010, 1012 to the first column. The foregoing can be examples of a first pattern characteristic.

Returning to FIG. 10, as noted the second region 1004 can comprise a square sub-matrix with n−k rows and n−k columns. In some embodiments, the second region 1004 can consist solely of such a square matrix. All of the "ones" in the second region 1004 can be disposed in a stepped pattern 1030 that extends from the upper, left corner to the lower, right corner of the second region 1004. Because the second region 1004 is square and the stepped pattern 1030 can extend from one corner (e.g., the cell at row $R_1$, column $C_{k+1}$) to an opposite corner (e.g., the cell at row $R_{n-k}$, column $C_n$), the slope of the stepped pattern 1030 can be negative one.

Figure 12:
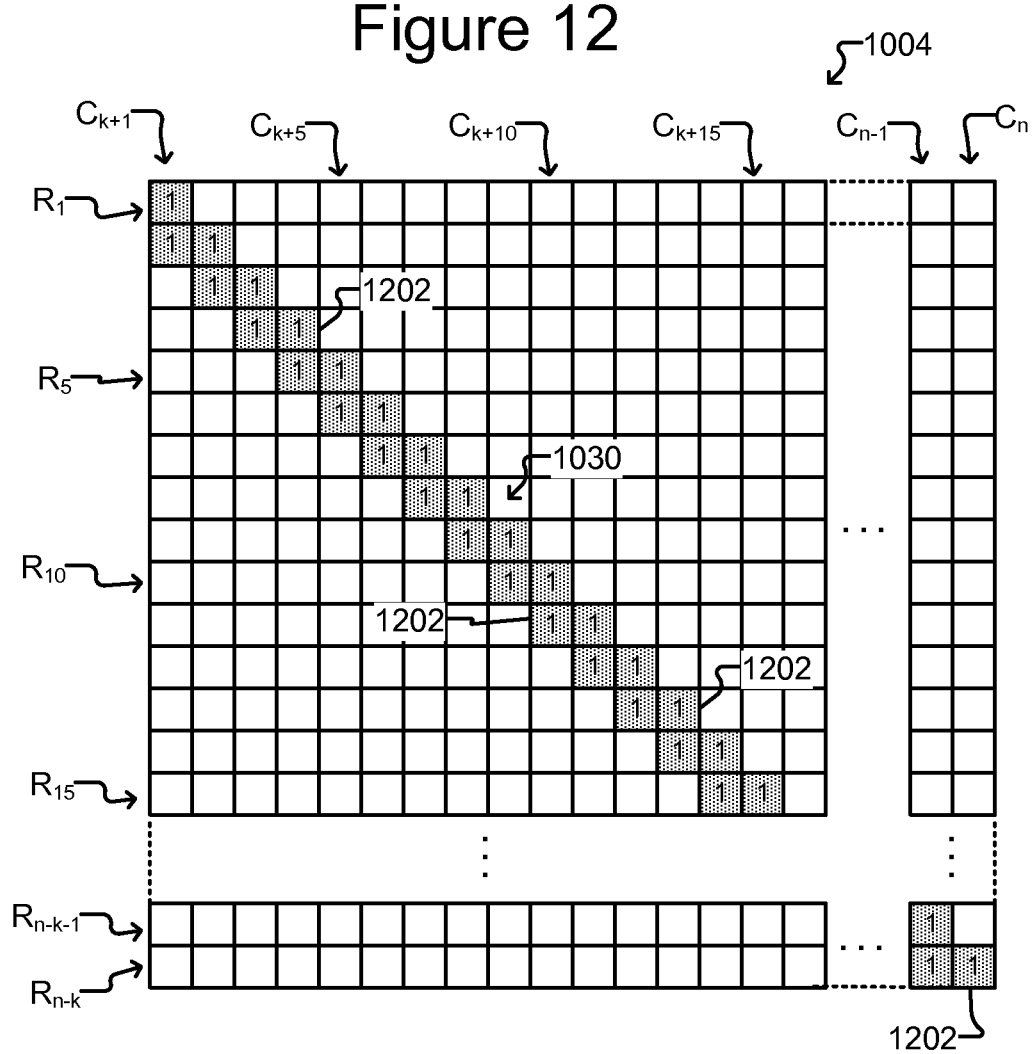
FIG. 12 illustrates cells in a "one" state disposed in a stepped pattern from a first corner to an opposite second corner of an n–k row, n–k column second region of the parity check matrix H of FIG. 10.

FIG. 12 illustrates an example of the second region 1004. Cells 1202 with "ones" are labeled with the number "1" and highlighted; all other cells have "zeros." As can be seen, the pattern 1030 can be such that there is a "one" in the extreme left column $C_{k+1}$ of the first row $R_1$ and a pair of "ones" in each of the other rows $R_2$ to $R_{n-k}$ of the second region 1004. The "ones" in the second row $R_2$ can be in the first two columns $C_{k+1}$ and $C_{k+2}$ of the second region 1004. The pair of "ones" in each succeeding row can be shifted one column to the right, with the pair of "ones" in the last row $R_{n-k}$ being in the last two columns $C_{n-1}$ and $C_n$.

Characteristics of the pattern 1030 of "ones" in the second region 1004 thus include one or more of the following: the pattern 1030 is stepped; the pattern 1030 steps from the upper left corner to the lower right corner of a square second region 1004; the slope of the pattern 1030 is negative one; the slope of the pattern 1030 is not equal to q (as defined above); and/or the pattern 1030 comprises a line that is two cells wide, and the line has any of the foregoing characteristics. The foregoing can be examples of a second pattern characteristic. The pattern 1030 of "ones" in the second region 1004 can also be characterized as an irregular repeat-accumulate (IRA) pattern, which can also be an example of a second pattern characteristic.

Figure 13:
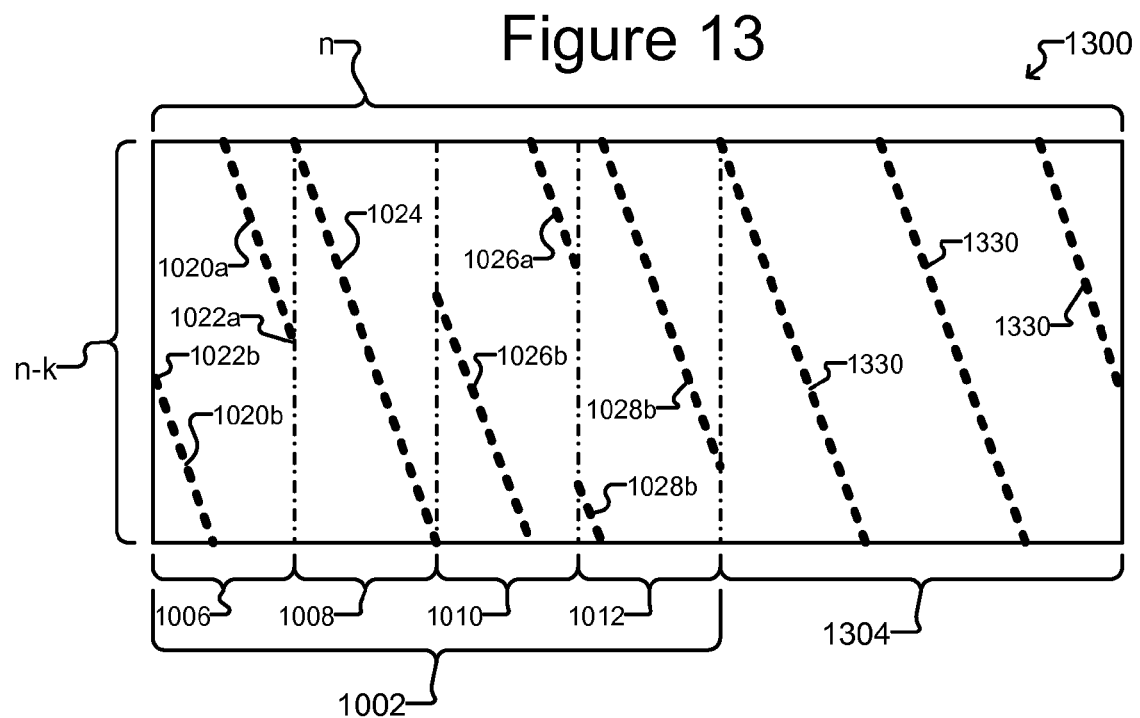
FIG. 13 illustrates a permuted parity check matrix πH in which the "ones" in the irregular repeat-accumulate second region of the parity check matrix H are permuted into the quasi-cyclic pattern of the first region according to some embodiments of the invention.

As illustrated in FIG. 13, the "ones" in the second region 1004 of the parity check matrix H 1000 can be permuted in the second region 1004 (see FIG. 10) such that all of the "ones" are on or are points of one or more new lines 1330 each having one or more characteristics of the lines 1020, 1024, 1026, 1028 in the first region 1002. The permuted second region is labeled 1304 in FIG. 13.

The number of columns k+1 to n in the second region 1304 can be an integer multiple of the number of columns M in each sub-matrix 1006, 1008, 1010, 1012 of the first region 1002. Although not shown in FIG. 13, the new lines 1330 can wrap from a column that corresponds to an integer multiple of the Mth column of the second region 1304 back M columns generally like the line 1020 wraps in the example of FIG. 11.

Characteristics of the pattern of "ones" in the permuted second region 1304 thus include that all such "ones" are (or correspond to points) on a line 1330 that has one or more of the following characteristics: the line has a slope equal to q (where q=(n−k)/M as discussed above); the line does not extend more than M columns in the second region 1304 but is confined to a single block of M columns of the second region 1304; and/or the line wraps with the slope equal to q from an i+Mth column to an Mth column in the second region 1304.

Figure 14:
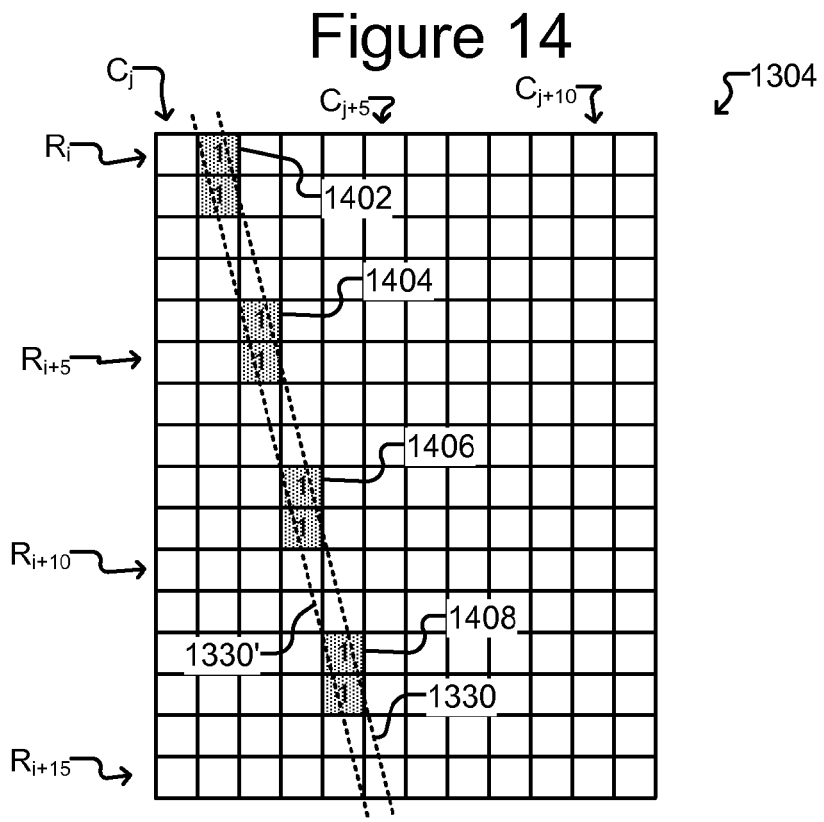
FIG. 14 illustrates cells in a "one" state disposed in lines having a slope q in the permuted second region of the permuted parity check matrix πH of FIG. 13.

FIG. 14, which shows some of the cells of the permuted second region 1304, illustrates an example. In FIG. 14, cells 1402, 1404, 1406, 1408 have "ones" that form part of one of the new lines 1330. As can be seen, the pattern is such that the cells 1402, 1404, 1406, 1408 with "ones" are spaced four columns and one row from each other. The value of q in the example shown in FIG. 14 is thus negative four. A second line 1330' is also shown in FIG. 14.

The following is an example of a permutation function π(H) that can be applied to the parity check matrix H 1000 to produce the permuted parity check matrix πH 1300. In this example the permutation function π(H) can be a column permutation function π(i) that permutes the n−k columns of the second region 1004. The column permutation function π(i) can be as follows: for each column i in the range 1 to k, π(i)=i; for each column i in the range k+1 to n, π(i)=k+1+M(ip mod q)+[ip/q], where ip=i−k−1 and M=(n−k)/q and [ip/q] is the largest integer less than or equal to ip/q (i.e., the floor of ip/q). The foregoing assumes q is positive.

FIG. 15 illustrates a process 1500 that is another example of a permutation function π(H) that can be applied to the parity check matrix H 1000 to produce the permuted parity check matrix πH 1300.

As shown in FIG. 15, at step 1502, the process 1500 can produce a serial stream of the contents of the second region 1004 of the parity check matrix H 1000. This can be done by reading the contents of each row $R_1$ to $R_{n-k}$ in sequence from the first column $C_{k+1}$ to the last column $C_n$ of each row. With reference to FIG. 16 (which illustrates the second region 1004 of the matrix H 1000), step 902 can thus produce a sequence of the contents of the second region 1004 as follows: $(R_1, C_{k+1})$, $(R_1, C_{k+2})$, $(R_1, C_{k+3})$, . . . , $(R_1, C_{n-1})$, $(R_1, C_n)$, $(R_2, C_{k+1})$, $(R_2, C_{k+2})$, $(R_2, C_{k+3})$, . . . , $(R_2, C_{n-1})$, $(R_2, C_n)$, $(R_3, C_{k+1})$, $(R_3, C_{k+2})$, $(R_3, C_{k+3})$, . . . , $(R_3, C_{n-1})$, $(R_3, C_n)$, . . . , $(R_{n-k-1}, C_{k+1})$, $(R_{n-k-1}, C_{k+2})$, $(R_{n-k-1}, C_{k+3})$, . . . , $(R_{n-k-1}, C_{n-1})$, $(R_{n-k-1}, C_n)$, $(R_{n-k}, C_{k+1})$, $(R_{n-k}, C_{k+2})$, $(R_{n-k}, C_{k+3})$, . . . , $(R_{n-k}, C_{n-1})$, $(R_{n-k}, C_n)$. The foregoing refer to the contents (i.e., "ones" or "zeros") of the cells of the second region 1004 (as shown in FIG. 16) of the matrix H 1000 (see FIG. 10).

Figure 17:
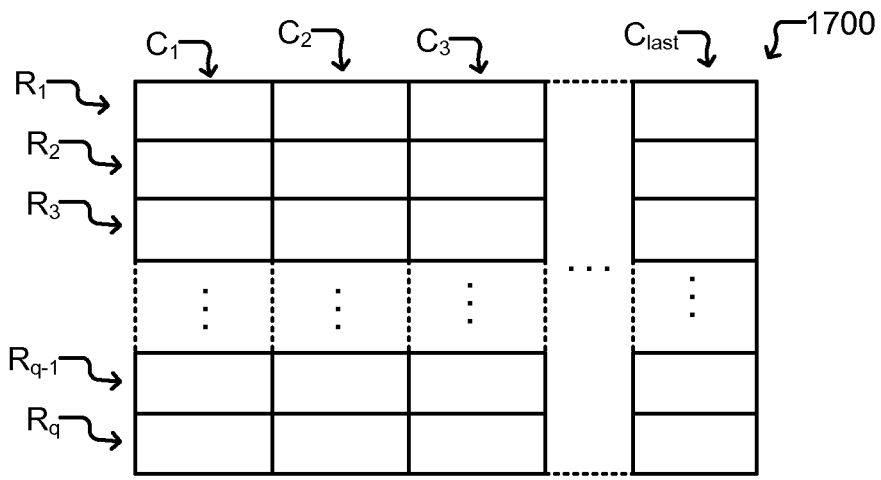
FIG. 17 illustrates a shift matrix that can be utilized by the process of FIG. 15 according to some embodiments of the invention.

At step 1504, the process 1500 can write the foregoing serial stream from the contents of the second region 1004 produced at step 1504 into a shift matrix S 1700 an example of which is illustrated in FIG. 17. The shift matrix S 1700 can have q number of rows, where q is as defined above (i.e., the slope of the lines 1020, 1024, 1026, 1028 in the first region 1002 of the matrix H 1000). Step 1504 can do so by writing the serial stream produced at step 1502 into each column $C_1$ to $C_{last}$ of the shift matrix S 1700 in sequence from the first row $R_1$ to the qth row $R_q$. The serial stream of the contents of the first region 1004 produced at step 1502 is thus written into the cells of the shift matrix S 1700 in the following order: $(R_1, C_1)$, $(R_2, C_1)$, $(R_3, C_1)$, . . . , $(R_{q-1}, C_1)$, $(R_q, C_1)$, $(R_1, C_2)$, $(R_2, C_2)$, $(R_3, C_2)$, . . . , $(R_{q-1}, C_2)$, $(R_q, C_2)$, $(R_1, C_3)$, $(R_2, C_3)$, $(R_3, C_3)$, . . . , $(R_{q-1}, C_3)$, $(R_q, C_3)$, . . . , $(R_1, C_{last})$, $(R_2, C_{last})$, $(R_3, C_{last})$, . . . , $(R_{q-1}, C_{last})$, $(R_q, C_{last})$. The foregoing refers to cells of the shift matrix S 1700 shown in FIG. 17.

Referring again to FIG. 15, at step 1506, the process 1500 can produce a serial stream of the contents of the shift matrix S 1700 by reading the contents of each row $R_1$ to $R_q$ in sequence from the first column $C_1$ to the last column $C_{last}$ of each row. With reference to FIG. 17 (which illustrates the shift matrix S 1700 of FIG. 17), step 1506 can thus produce a sequence of the contents of the shift matrix S 1700 as follows: $(R_1, C_1)$, $(R_1, C_2)$, $(R_1, C_3)$, . . . , $(R_1, C_{last})$, $(R_2, C_1)$, $(R_2, C_2)$, $(R_2, C_3)$, . . . , $(R_2, C_{last})$, $(R_3, C_1)$, $(R_3, C_2)$, $(R_3, C_3)$, . . . , $(R_3, C_{last})$, . . . , $(R_{q-1}, C_1)$, $(R_{q-1}, C_2)$, $(R_{q-1}, C_3)$, . . . , $(R_{q-1}, C_{last})$, $(R_q, C_1)$, $(R_q, C_2)$, $(R_q, C_3)$, . . . , $(R_q, C_{last})$. The foregoing refers to the contents (i.e., "ones" or "zeros") of the cells of the shift matrix S 1700.

Figure 18:
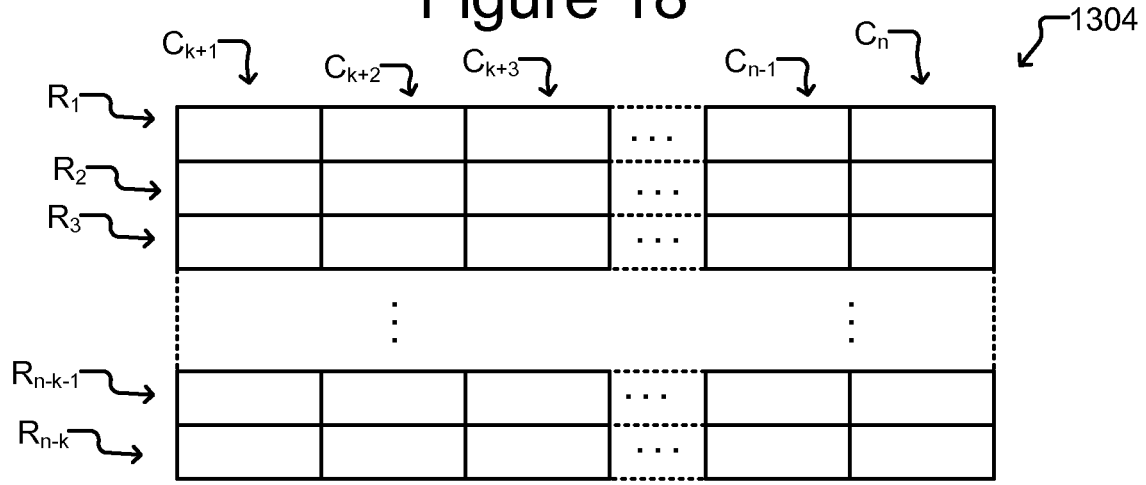
FIG. 18 shows cells of the permuted second region of the permuted parity check matrix πH of FIG. 13.

At step 1508 of FIG. 15, the process can write the foregoing serial stream from the contents of the shift matrix S 1700 produced at step 1506 into the permuted second region 1304 of the permuted parity check matrix πH 1300. Step 1508 can do so by writing the serial stream into each row $R_1$ to $R_{n-k}$ in sequence from the first column $C_{k+1}$ to the last column $C_n$ of each row. With reference to FIG. 18 (which illustrates the permuted second region 1304 of the permuted parity check matrix πH 1300), the serial stream of the contents of the shift matrix S 1700 produced at step 1506 is thus written into the cells of the second region 1004 (which thus becomes the permuted second region 1304) as follows: $(R_1, C_{k+1})$, $(R_1, C_{k+2})$, $(R_1, C_{k+3})$, . . . , $(R_1, C_{n-1})$, $(R_1, C_n)$, $(R_2, C_{k+1})$, $(R_2, C_{k+2})$, $(R_2, C_{k+3})$, . . . , $(R_2, C_{n-1})$, $(R_2, C_n)$, $(R_3, C_{k+1})$, $(R_3, C_{k+2})$, $(R_3, C_{k+3})$, . . . , $(R_3, C_{n-1})$, $(R_3, C_n)$, . . . , $(R_{n-k-1}, C_{k+1})$, $(R_{n-k-1}, C_{k+2})$, $(R_{n-k-1}, C_{k+3})$, . . . , $(R_{n-k-1}, C_{n-1})$, $(R_{n-k-1}, C_n)$, $(R_{n-k}, C_{k+1})$, $(R_{n-k}, C_{k+2})$, $(R_{n-k}, C_{k+3})$, . . . , $(R_{n-k}, C_{n-1})$, $(R_{n-k}, C_n)$. The foregoing refer to cells of the second region 1004 (which is now deemed the permuted second region 1304 as shown in FIG. 18) of the permuted parity check matrix πH 1300.

In some embodiments, the "zeros" and "ones" of the second region 1004 of the matrix H 1000 can thus be permuted in groups of q (as defined above). For example, at least some of the "ones" in the permuted pattern of the permuted second region 1304 can thus be moved with respect to the pattern in the second region 1004 by q number of cells, rows, or columns. As another example, at least some pairs of adjacent "ones" in the pattern in the second region 1004 can be separated by q number of cells, rows, or columns in the permuted second region 1304.

Generally as discussed above, the decoder 500 of FIG. 5, operating according to the process 900 of FIG. 9, can decode received vectors r encoded per the QC-IRA LDPC FEC code defined by the parity check matrix H 1000. Moreover, also as generally discussed above, reorder module 504 can be configured to permute the probabilities $r_1, r_2, \ldots, r_n$ of received vectors r in accordance with a permutation function π(r) that corresponds to the π(H), discussed above, used to generate the permuted parity check matrix πH 1300 from the parity check matrix H 1000, and the permuted decode module 508 can be configured to decode permuted received vectors πr output 506 by the reorder module in accordance with the Tanner-Graph of the permuted parity check matrix πH 1300.

Figure 19:
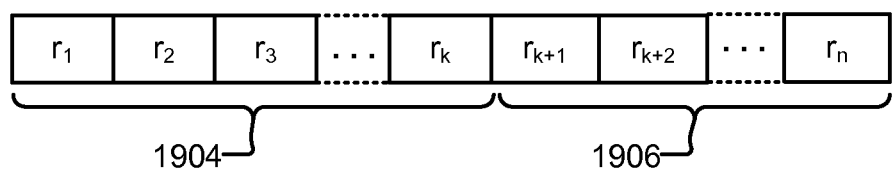
FIG. 19 illustrates a received vector r having an information first section and a parity second section.

That is, with reference to FIGS. 5 and 9, at step 902, the process 900 of FIG. 9 can receive a stream of received vectors r (e.g., like 520 in FIG. 5) each encoded using a QC-IRA LDPC code that corresponds to the parity check matrix H 1000 of FIG. 10. An example of such a received vector r 1902 is shown in FIG. 19 as received vector r 1902. As shown, each received vector r 1902 can comprise a first section 1904 comprising k information probabilities $r_1, r_2, r_3, \ldots, r_k$ that correspond to information bits of the corresponding codeword c, and a second section 1906 comprising n-k parity probabilities $r_{k+1}, r_{k+2}, \ldots, r_n$ that correspond to parity bits of the corresponding codeword c.

At step 904 of FIG. 9, the process 900 can permute each received vector r in accordance with a permutation function π(r) that corresponds to the permutation function π(H) used to produce the permuted parity check matrix πH 1300 from the parity check matrix H 1000. As discussed above, one example of a permutation function π(H) that can be applied to the parity check matrix H 1000 to produce the permuted parity check matrix πH 1300 is the column permutation function π(i): for each column i in the range 1 to k, π(i)=i; for each column i in the range k+1 to n, π(i)=k+1+M(ip mod q)+[iq/q], where ip=i−k−1 and M=(n−k)/q and [ip/q] is the largest integer less than or equal to ip/q (i.e., the floor of ip/q). The foregoing assumes q is positive. A similar permutation function can be applied to the received vector r 1902 received at step 904 to produce the permuted received vector r 2002.

Figure 20A:
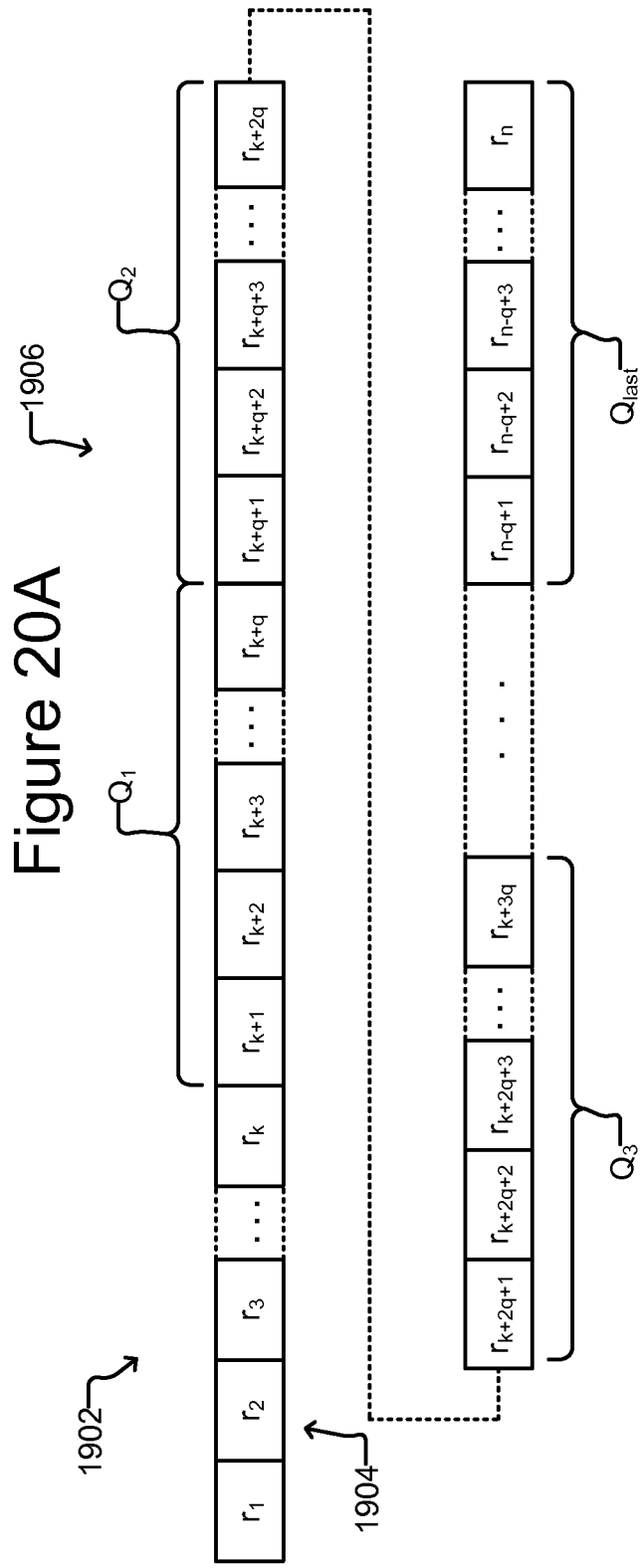
FIG. 20A shows the received vector r of FIG. 19 illustrating a division of the parity second section into groups of Q probabilities according to some embodiments of the invention.
Figure 20B:
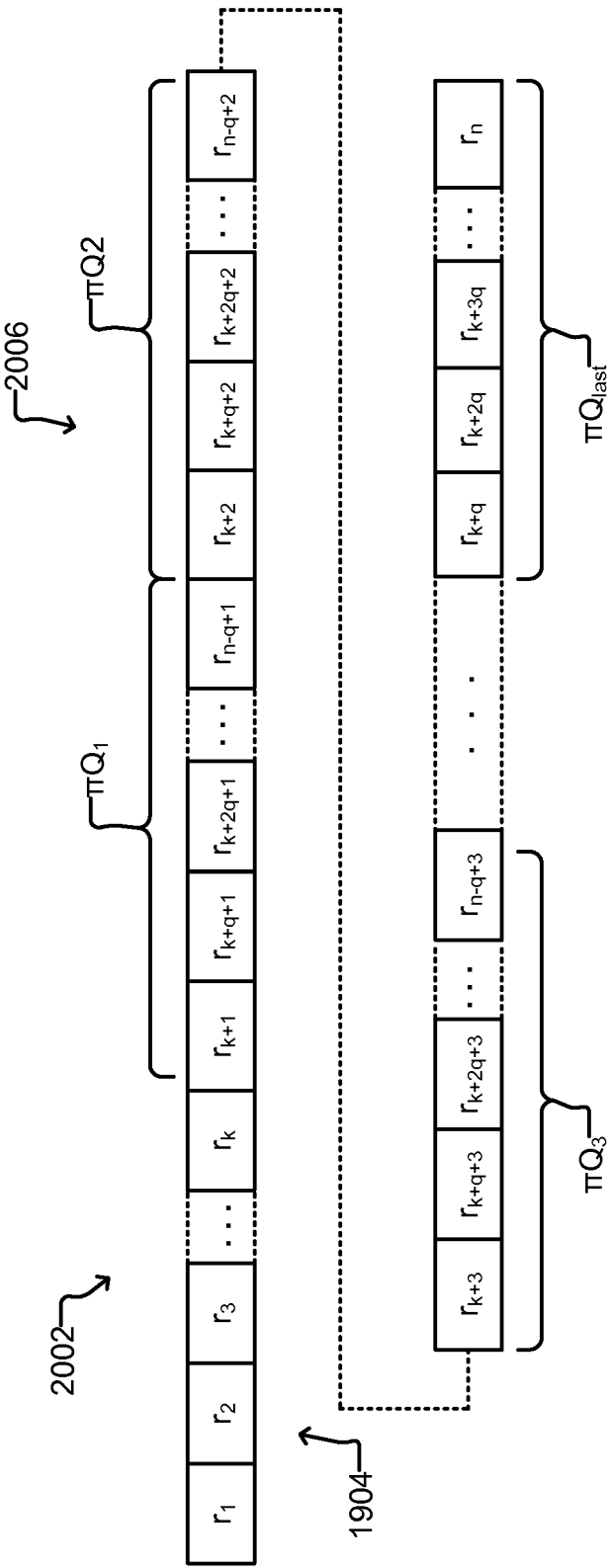
FIG. 20B illustrates an example of a permuted received vector πr in which the probabilities in each of the groups of Q probabilities is permuted according to some embodiments of the invention.

As also discussed above, FIG. 15 illustrates a process 1500 that is another example of a permutation function π(H) that can be applied to the parity check matrix H 1000 to produce the permuted parity check matrix πH 1300. As also discussed above, the permutation function π(H) applied to the second region 1004 of the matrix H 1000 involved writing the second region 1004 column-wise into the shift matrix S 1700 and reading those values row-wise from the shift matrix S 1700 (see FIG. 17). A similar permutation function π(r) can be applied to the n-k parity probabilities $r_{k+1}, r_{k+2}, \ldots, r_n$ of the second section 1906 of a received vector r 1902. That is, the n-k parity probabilities $r_{k+1}, r_{k+2}, \ldots, r_n$ can be written into the first column $C_1$, then the second column $C_2$, then the third column $C_3$, and so on of the shift matrix S 1700. This will result in the first q (as defined above) parity probabilities $r_{k+1}, r_{k+2}, r_{k+3}, \ldots, r_{k+q}$ being written into column $C_1$. These q number of parity probabilities are identified in FIG. 20A as a first $Q_1$ group. Still referring to FIG. 20A, succeeding groups of q number of parity probabilities $r_{k+1}, r_{k+2}, \ldots, r_n$ are written into the succeeding columns $C_2, C_3, \ldots, C_{last}$ of the shift matrix S 1700 (see FIG. 17). The result can be the permuted received vector $\pi r$ 2002 illustrated in FIG. 20B in which the Q parity bit groups are now permuted versions $\pi Q_1 \pi Q_2 \pi Q_3 \pi Q_{last}$ of the Q parity groups versions $Q_1 Q_2 Q_3 Q_{last}$ in the received vector r 1902. The n–k parity probabilities $r_{k+1}, r_{k+2}, \ldots, r_n$ of the received vector r are now permuted in the permuted received vector $\pi r$ 2002 in the same way as the permuted second region 1304 of the permuted parity check matrix $\pi H$ 1300.

In any implementation of the permuted decode module 508, the processors 602, 604 can be configured to, at each iteration of the variable nodes and check nodes as discussed above with respect to FIG. 3, complete the calculations at all of the variable nodes before making any of the calculations at the check nodes during an iteration and then complete all of the calculations at the check nodes before making any of the calculations at the variable nodes for the next iteration generally as discussed above with respect to FIG. 3. This is, however, but an example, and the permuted decode module 508 can comprise alternative configurations.

Figure 21:
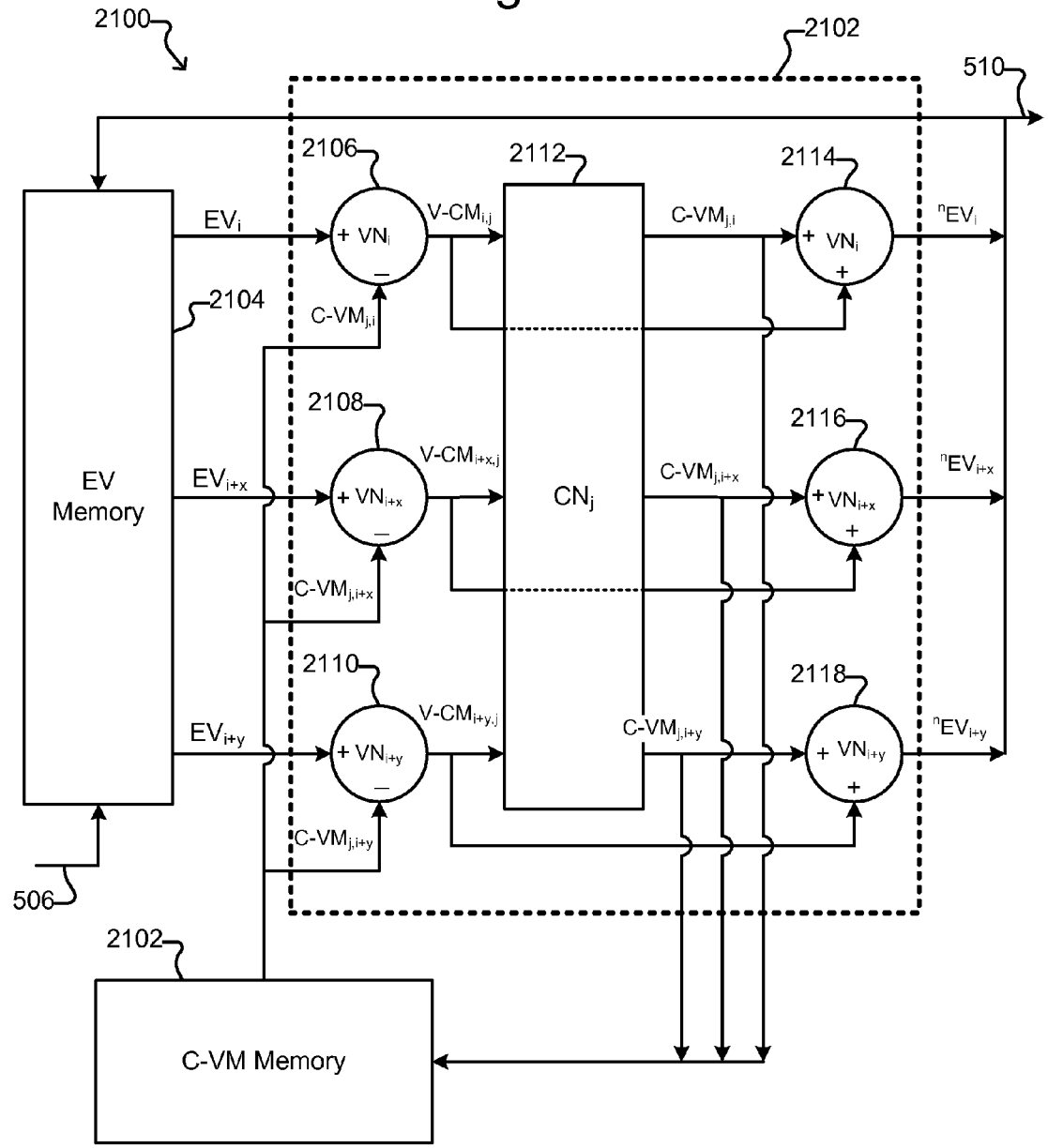
FIG. 21 illustrates a combined variable/check node processor that can be used to implement some embodiments of the permuted decode module of FIG. 5 according to some embodiments of the invention.

For example, the permuted decode module 508 can alternatively be configured to perform the calculations of variable nodes and check nodes in combined variable/check node processors generally as discussed in U.S. Pat. No. 8,266,493, which is incorporated herein in its entirety by reference. FIG. 21 illustrates an example of a combined variable/check node (CNP) processor 2102. Although discussed below with respect to the permuted parity check matrix $\pi H$ 1300 of FIG. 13, the CNP processor 2102 is equally applicable to the permuted parity check matrix $\pi H$ 700 of FIG. 7.

The system 2100 of FIG. 21, including the CNP processor 2102, can form part of a possible configuration of the permuted decode module 508 of FIG. 5 configured to decode permuted received vectors $\pi r$ 2002 (see FIG. 20B) in accordance with the permuted parity check matrix $\pi H$ 1300 of FIG. 13. For the sake of example, it is assumed that, among other "ones," there are "ones" in the jth row at columns i, i+x, and i+y of the permuted parity check matrix $\pi H$ 1300. Per the discussion of FIGS. 2 and 3 above, there are thus connections (like connections 322, 324, 326, 328, 330 in FIG. 3) between the ith, the ith+x, and the ith+y variable nodes and the jth check node that correspond to a Tanner-Graph of the permuted parity check matrix $\pi H$ 1300. (See the discussion above of FIGS. 2 and 3.)

In operation, the system 2100 of FIG. 21 can operate as follows. As shown, the system 2100 can comprise an EV memory 2104 in which are stored the current estimated values (EVs) of the $r_i, r_{i+x}$, and $r_{i+y}$ probabilities of a received vector r. As shown, the current estimated values $EV_i$, $EV_{i+x}$, and $EV_{i+y}$ of the ith, the ith+x, and the ith+y probabilities r of the permuted received vector $\pi r$ 2002 are provided from the EV memory 2104 to subtractors 2106, 2108, 2110, which produce messages V-CM$_{i,j}$, V-CM$_{i+x,j}$, V-CM$_{i+y,j}$ to a check calculator 2112 as shown. The check calculator 2112 performs a parity check calculation on the V-CM$_{i,j}$, V-CM$_{i+x,j}$, V-CM$_{i+y,j}$ messages to produce messages C-VM$_{j,i}$, C-VM$_{j,i+x}$, and C-VM$_{j,i+y}$, which are provided to adders 2114, 2116, 2118 and a C-VM memory 2120 as shown. The adders 2114, 2116, 2118 add the C-VM$_{j,i}$, C-VM$_{j,i+x}$, and C-VM$_{j,i+y}$ messages to the V-CM$_{i,j}$, V-CM$_{i+x,j}$, V-CM$_{i+y,j}$ messages to produce new estimated values "$EV_i$, "$EV_{i+x}$, and "$EV_{i+y}$ of the ith, the ith+x, and the ith+y probabilities r of the permuted received vector $\pi r$ 2002, which replace the current estimated values $EV_i$, $EV_{i+x}$, and $EV_{i+y}$ of the ith, the ith+x, and the ith+y probabilities r in the EV memory 2104 as shown.

Thereafter, repeated iterations repeatedly produce new estimated values "$EV_i$, "$EV_{i+x}$, and "$EV_{i+y}$ of the ith, the ith+x, and the ith+y probabilities r of the permuted received vector $\pi r$ 2002 until the new estimated values "$EV_i$, "$EV_{i+x}$, and "$EV_{i+y}$ are believed to be the correct values of the ith, the ith+x, and the ith+y probabilities r or the iterations are otherwise stopped, at which time those new estimated values "$EV_i$, "$EV_{i+x}$, and "$EV_{i+y}$ can be provided as output 510 (see FIG. 5).

The substractor 2106 and adder 2114 perform the function of the ith variable node in the Tanner-Graph of the permuted parity check matrix $\pi H$ 1300 of FIG. 13. Likewise, the substractor 2108 and adder 2116 perform the function of the i+xth variable node and the substractor 2110 and adder 2118 perform the function of the i+yth variable node in the Tanner-Graph of the permuted parity check matrix $\pi H$ 1300 of FIG. 13. The check calculator performs the function of the jth check node in the Tanner-Graph of the permuted parity check matrix $\pi H$ 1300 of FIG. 13. The CNP can perform the variable node function (and check node function) in either the original parity check matrix or permuted parity check matrix.

The CNP 2102 illustrated in FIG. 21 is an example only. For example, there can be more or fewer than three VNs and more than one CN combined into a single CNP 2102. Moreover, as noted above, the variable nodes VN$_i$ 2106, VN$_{i+x}$ 2108, VN$_{i+y}$ 2110 and the check node CN$_j$ 2112 are only a few of the VN$_1$, VN$_2$, ..., VN$_n$ variable nodes and CN$_1$, CN$_2$, ..., CN$_{n-k}$ check nodes of a Tanner-Graph implementation of the permuted parity check matrix $\pi H$ 1300 of FIG. 13. The system 2100 can thus include additional CNP processors (not shown) that implement all such variable nodes and check nodes and thus calculate estimated values for the other probabilities r of the received vector r. Such additional CNP processors (not shown) can be connected to the EV memory 2104 and the C-VM memory 2102 and can be interconnected with each other and with the CNP processor 2102 as need to meet the processing and interconnection requirements of the variable nodes and check nodes of the Tanner-Graph of the permuted parity check matrix $\pi H$ 1300.

Decoding with a permuted parity check matrix $\pi H$ 700, 1300 can improve decoding efficiencies in a variety of applications. For example, as disclosed in the paper by M. Gomes et al., "HDL Library of Processing Units For Generic and DVB-S2 LDPC Decoding," International Conference on Signal Processing and Multimedia Applications (SIGMAP2006), Setubal, Portugal (2006), Gomes et al. proposed a parallel decoding technique for use with the DVB-S2 Codes. As discussed above, the DVB-S2 Codes can be characterized as QC-IRA LDPC codes, and the parity check matrix H 1000 of FIG. 10 is accordingly representative of the parity check matrices of the DVB-S2 codes. As discussed below with respect to FIG. 22, the decoder 2200 improves upon Gomes decoding technique.

FIG. 22 illustrates another example of a decode module configuration 2200 of the permuted decode module 508 of FIG. 5. That is, the permuted decode module 508 can be configured as shown in FIG. 22 to decode received vectors r 1902 (see FIG. 19) in accordance with the permuted parity check matrix all 1300 of FIG. 13.

As shown, the decoder configuration 2200 can comprise M parallel processors CNP$_1$, CNP$_2$, CNP$_3$, ..., CMP$_M$ (hereinafter referred to collectively as the parallel CNPs 2202) each configured to perform the processing of one or more variable nodes and check node(s) in a combined processor (generally as discussed above with respect to FIG. 21). As discussed above, the first region 1002 of permuted parity check matrix πH 1300 of FIG. 13 comprises sub-matrices 1004, 1006, 1008, 1012 each of which is M columns wide, and the second region 1004 can be an integer number of M columns wide. Thus, the entire permuted parity check matrix πH 1300 can be an integer multiple of M columns wide, and that integer can be equal to n/M. With its M parallel processor CNPs 2204, the decode module 2200 of FIG. 22 can thus process each row of the permuted parity check matrix πH 1300 of FIG. 13 in groups of M columns, which can correspond to the sub-matrices 1006, 1008, 1010, 1012 and each M group of columns in the second region 1304.

As shown in FIG. 22, the decode module 2200 includes an EV memory 2204 in the form of an n/M row by M column matrix. The EV memory 2204 thus includes a column $C_1, C_2, C_3, \ldots, C_M$ for each of the parallel CNP processors 2202 and a row $R_1, R_2, R_3, \ldots, R_{n/M}$ for the total number of sub-matrices 1006, 1008, 1010, 1012 in the first region 1002 of the permuted parity check matrix πH 1300 and the number of M groups of columns in the permuted second region 1304. As also shown, the decode module 2200 can also include a C-VM memory 2206 in the form of an E/M row by M column matrix, where E is the number of connections from variable nodes to check nodes in a Tanner-Graph implementation of the permuted parity check matrix πH 1300.

As the parallel CNPs 2202 successively process each sub-matrix 1006, 1008, 1010, 1012 of the first region 1002 of the permuted parity check matrix πH 1300 of FIG. 13 and each M group of columns in the second region 1304, previous EVs of the M number of the probabilities r of the permuted received vector πr 1902 are read from a row of the EV memory 2204 and provided through bus 2218 to a barrel shifter 2208 and then through bus 2216 to the parallel CNPs 2202. At the same time, an M number of previous C-VMs are read from a row of the C-VM memory 2206 and provided through the bus 2220 to the parallel CNPs 2202, which then use the EVs from the EV memory 2204 and the C-VMs from the C-VM memory 2206 to calculate new EVs for the M number of probabilities r and the M number of new C-VM messages. The new EVs are passed through the shift barrel 2208 and written into a row of the EV memory 2204. The new C-VMs are similarly written into a row of the C-VM memory 2206.

A counter 2210 can count the number of iterations and increment an address generator 2212 to move to the next row in the EV memory 2204 and the next row in the C-VM memory 2206. The counter 2210 can also control the amount of shift by the barrel shifter(s) 2208.

The permuted decode module 2200 of FIG. 22 can thus decode a permuted received vector πr 2002 (see FIG. 20B) by successively processing each row of the permuted parity check matrix πH 1300 in groups of M columns. Moreover, because the pattern of "ones" in the permuted second region 1304 of the permuted parity check matrix πH 1300 has a same characteristic as the "ones" in the first region 1202 and the received vector r being decoded is a permuted received vector r 2002, the permuted decode module 2200 of FIG. 22 can decode all n probabilities of the permuted received vector πr 2002 and traverse the connections from the variable nodes to all of the check nodes of the Tanner-Graph of the permuted parity check matrix πH. This is in contrast to Gomes, who proposed using M parallel processors and an EV memory and a C-VM memory in the form of M column wide matrices to decode only the k information probabilities of a received vector r being decoded. Because Gomes lacked the insight of decoding based on a version of the parity check code matrix H permuted so that the "ones" in all regions of the matrix H have a same pattern characteristic, Gomes could not effi-ciently and effectively apply their proposed decoding technique to decoding both the k information probabilities and the n−k parity probabilities of the received vector r.

Whether configured as in 2200 in FIG. 22, as one or more CNPs 2102 as in FIG. 21, or in accordance with a standard Tanner-Graph configuration, the decoder 500 of FIG. 5, which as noted can operate in accordance with the process 900 of FIG. 9, can be used in a variety of applications. For example, the decoder 500 can replace the probability decoder 116 in the data transmission system 100 of FIG. 1.

Although specific embodiments and applications of the invention have been described in this specification, these embodiments and applications are exemplary only, and many variations are possible.

We claim:

1. A process of decoding a received vector r encoded in accordance with a forward error correction code, wherein said received vector r comprises a first section of k probabilities and a second section of n−k probabilities, wherein said forward error correction code corresponds to an n−k row by n column parity check matrix H, wherein said matrix H comprises a first region of k columns and a second region of n−k columns, wherein all ones of said matrix H in said first region are in a first pattern having a first pattern characteristic and all ones of said matrix H in said second region are in a second pattern having a second pattern characteristic that is different than said first pattern characteristic, said process comprising:

permuting by an electronic processor circuit in accordance with a permutation function one of said first section or said second section of said received vector r to produce a permuted received vector πr, wherein application of said permutation function to a corresponding one of said first region or said second region of said matrix H produces a permuted parity check matrix H comprising one of said first region or said second region of said parity check matrix H and a permuted version of the other of said second region or said first region of said parity check matrix H such that all ones in both regions of said permuted parity check matrix πH are in a pattern having either said first pattern characteristic or said second pattern characteristic; and decoding by said electronic processor circuit said permuted received vector πr in accordance with said permuted parity check matrix πH.

2. The process of claim 1, wherein:

said permuting comprises permuting in accordance with said permutation function said n−k probabilities of said second section of said received vector r to produce said permuted received vector πr comprising said first section of k probabilities and a permuted version of said second section of n−k probabilities, and said decoding comprises decoding said permuted received vector πr in accordance with said permuted parity check matrix πH comprising said first region of k columns and said permuted version of said second region of n−k columns.

3. The process of claim 2, wherein:

said first region of said parity check matrix H comprises a plurality of contiguous n−k row by M column sub-matrices, and said first pattern characteristic is that said all ones in said first region are points on lines in said sub-matrices having a slope q, where q equals n−k/M.

4. The process of claim 3, wherein:
said second characteristic is that said all ones in said second region are part of a stepped pattern from one corner to an opposite corner of said second region, and
said stepped pattern has a slope that is different than q.

5. The process of claim 4, wherein said all of said ones in said permuted second region of said permuted parity check matrix πH are points on a line having said slope q.

6. The process of claim 3, wherein said permuting step reorders said n−k probabilities of said second section in groups of q probabilities, where q equals n−k/M.

7. The process of claim 3, wherein said permuting step reorders said n−k probabilities of said second section such that contiguous pairs of said n−k probabilities in said second section of said received vector r are separated by q probabilities in said permuted received vector πp, where q equals n−k/M.

8. The process of claim 3, wherein, in said permuted pattern, each of at least some of said ones in said permuted version of said second region are a distance q from positions of each of said at least some of said ones in said second pattern, where q equals n−k/M.

9. The process of claim 3, wherein said decoding step comprising decoding said permuted received vector πr with a permuted decode module comprising variable nodes interconnected with check nodes in accordance with at least part of a Tanner-Graph of said permuted parity check matrix πH.

10. The process of claim 1, wherein said electronic processor circuit comprises at least one of:
digital logic circuitry; or
a digital memory device configured to store machine readable instructions and a digital processor configured to operate in accordance with said machine readable instructions.

11. A process of decoding a received vector r encoded in accordance with a forward error correction code, wherein said received vector r comprises a first section of k probabilities and a second section of n−k probabilities, wherein said forward error correction code corresponds to an n−k row by n column parity check matrix H, wherein said matrix H comprises a first region of k columns and a second region of n−k columns, wherein all ones of said matrix H in said first region are in a first pattern having a first pattern characteristic and all ones of said matrix H in said second region are in a second pattern having a second pattern characteristic that is different than said first pattern characteristic, said process comprising:
permuting in accordance with a permutation function one of said first section or said second section of said received vector r to produce a permuted received vector πr, wherein application of said permutation function to a corresponding one of said first region or said second region of said matrix H produces a permuted parity check matrix πH comprising one of said first region or said second region of said parity check matrix H and a permuted version of the other of said second region or said first region of said parity check matrix H such that all ones in both regions of said permuted parity check matrix πH are in a pattern having either said first pattern characteristic or said second pattern characteristic; and
decoding said permuted received vector πr in accordance with said permuted parity check matrix πH,
wherein:
said permuting comprises permuting in accordance with said permutation function said n−k probabilities of said second section of said received vector r to produce said permuted received vector πr comprising said first section of k probabilities and a permuted version of said second section of n−k probabilities,
said decoding comprises decoding said permuted received vector πr in accordance with said permuted parity check matrix πH comprising said first region of k columns and said permuted version of said second region of n−k columns,
said first region of said parity check matrix H comprises a plurality of contiguous n−k row by M column sub-matrices,
said first pattern characteristic is that said all ones in said first region are points on lines in said sub-matrices having a slope q, where q equals n−k/M, and
said decoding step further comprises performing calculations of at least some of said variable nodes and at least one of said check nodes in a combined variable/check node processor.

12. The process of claim 11, wherein said decoding step further comprises:
successively calculating with M parallel combined variable/check node processors new estimated values for M of said probabilities of said permuted received vector and new check-to-variable-node messages from previous estimated values for said M of said probabilities stored in a first M column wide memory and previous check-to-variable-node messages stored in a second M column wide memory;
storing successive new estimated values for said M of said probabilities of said permuted received vector in said first M column wide memory; and
storing successive new check-to-variable-node messages in said second M column wide memory.

13. A decoder for decoding a received vector r encoded in accordance with a forward error correction code, wherein said received vector r comprises a first section of k probabilities and a second section of n−k probabilities, wherein said forward error correction code corresponding to a parity check matrix H comprising a first region of k columns and a second region of n−k columns, wherein all ones of said matrix H in said first region are in a first pattern having a first pattern characteristic and all ones of said matrix H in said second region are in a second pattern having a second pattern characteristic that is different than said first pattern characteristic, said decoder comprising:
a reorder module configured to permute in accordance with a permutation function one of said first section or said second section of said received vector r to produce a permuted received vector πr, wherein application of said permutation function to a corresponding one of said first region or said second region of said matrix H produces a permuted parity check matrix πH comprising one of said first region or said second region of said parity check matrix H and a permuted version of the other of said second region or said first region of said parity check matrix H such that all ones in both regions of said permuted parity check matrix πH are in a pattern having either said first pattern characteristic or said second pattern characteristic; and
a permuted decode module configured to decode said permuted received vector πr in accordance with said permuted parity check matrix πH;
wherein said reorder module and said permuted decode module comprise an electronic processor circuit comprising at least one of: digital logic circuitry; or a digital memory device configured to store machine readable instructions and a digital processor configured to operate in accordance with said machine readable instructions.

14. The decoder of claim 13, wherein:
said reorder module is further configured to permute in accordance with said permutation function said n−k probabilities of said second section of said received vector r to produce said permuted received vector πr comprising said first section of k probabilities and a permuted version of said second section of n−k probabilities, and
said permuted decode module is further configured to decode said permuted received vector πr in accordance with said permuted parity check matrix πH comprising said first region of k columns and said permuted version of said second region of n−k columns.

15. The decoder of claim 14, wherein:
said first region of said parity check matrix H comprises a plurality of contiguous n−k row by M column sub-matrices, and
said first pattern characteristic is that said all ones in said first region are points on lines in said sub-matrices each having a slope q, where q equals n−k/M.

16. The decoder of claim 15, wherein:
said second characteristic is that said all ones in said second region are part of a stepped pattern from one corner to an opposite corner of said second region, and
said stepped pattern has a slope that is different than q, where q equals n−k/M.

17. The decoder of claim 16, wherein said all of said ones in said permuted second region of said permuted parity check matrix πH are points on at least one line having said slope q, where q equals n−k/M.

18. The decoder of claim 15, wherein said reorder module is configured to reorder said n−k probabilities of said second section in groups of q probabilities, where q equals n−k/M.

19. The decoder of claim 15, wherein, in said permuted pattern, each of at least some of said ones in said permuted version of said second region is a distance q from positions of each of said at least some of said ones in said second pattern, where q equals n−k/M.

20. The decoder of claim 15, wherein, in said permuted version of said second section, contiguous pairs of said n−k probabilities in said second section of said received vector r are separated by q probabilities in said permuted version of said second section, where q equals n−k/M.

21. The decoder of claim 15, wherein said permuted decode module comprises variable nodes interconnected with check nodes in accordance with at least part of a Tanner-Graph of said permuted parity check matrix πH.

22. A decoder for decoding a received vector r encoded in accordance with a forward error correction code, wherein said received vector r comprises a first section of k probabilities and a second section of n−k probabilities, wherein said forward error correction code corresponding to a parity check matrix H comprising a first region of k columns and a second region of n−k columns, wherein all ones of said matrix H in said first region are in a first pattern having a first pattern characteristic and all ones of said matrix H in said second region are in a second pattern having a second pattern characteristic that is different than said first pattern characteristic, said decoder comprising:
a reorder module configured to permute in accordance with a permutation function one of said first section or said second section of said received vector r to produce a permuted received vector πr, wherein application of said permutation function to a corresponding one of said first region or said second region of said matrix H produces a permuted parity check matrix πH comprising one of said first region or said second region of said parity check matrix H and a permuted version of the other of said second region or said first region of said parity check matrix H such that all ones in both regions of said permuted parity check matrix πH are in a pattern having either said first pattern characteristic or said second pattern characteristic; and
a permuted decode module configured to decode said permuted received vector πr in accordance with said permuted parity check matrix πH,
wherein:
said reorder module is further configured to permute in accordance with said permutation function said n−k probabilities of said second section of said received vector r to produce said permuted received vector πr comprising said first section of k probabilities and a permuted version of said second section of n−k probabilities, said permuted decode module is further configured to decode said permuted received vector πr in accordance with said permuted parity check matrix πH comprising said first region of k columns and said permuted version of said second region of n−k columns,
said first region of said parity check matrix H comprises a plurality of contiguous n−k row by M column sub-matrices,
said first pattern characteristic is that said all ones in said first region are points on lines in said sub-matrices each having a slope q, where q equals n−k/M,
said permuted decode module comprises variable nodes interconnected with check nodes in accordance with at least part of a Tanner-Graph of said permuted parity check matrix πH, and
at least some of said variable nodes and at least one of said check nodes are configured in a combined variable/check node digital processor.

* * * * *